United States Patent
Seo et al.

(10) Patent No.: US 12,159,572 B2
(45) Date of Patent: Dec. 3, 2024

(54) DISPLAY DEVICE

(71) Applicant: LG Display Co., Ltd., Seoul (KR)

(72) Inventors: Daeyoung Seo, Seoul (KR); Juhyun Nam, Seoul (KR); Yongmin Ha, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/416,688

(22) Filed: Jan. 18, 2024

(65) Prior Publication Data

US 2024/0257716 A1 Aug. 1, 2024

(30) Foreign Application Priority Data

Jan. 31, 2023 (KR) ........................ 10-2023-0012883

(51) Int. Cl.
*G09G 3/32* (2016.01)
*H01L 25/16* (2023.01)
*H01L 27/12* (2006.01)

(52) U.S. Cl.
CPC ............. *G09G 3/32* (2013.01); *H01L 25/167* (2013.01); *H01L 27/124* (2013.01); *G09G 2320/0223* (2013.01); *G09G 2320/0233* (2013.01); *G09G 2360/14* (2013.01)

(58) Field of Classification Search
CPC ....... H01L 27/124; H01L 25/167; G09G 3/32; G09G 2360/14; G09G 2320/0223; G09G 2320/0233; G09G 2360/122; G09G 2300/023; G09G 2300/026
See application file for complete search history.

(56) References Cited

U.S. PATENT DOCUMENTS

| | | | | |
|---|---|---|---|---|
| 10,468,397 | B2* | 11/2019 | Cok | H01L 27/14643 |
| 11,247,439 | B2* | 2/2022 | Takagishi | H01L 33/56 |
| 11,262,967 | B2* | 3/2022 | Ye | H10K 59/131 |
| 11,340,855 | B2* | 5/2022 | Huang | G09B 5/02 |
| 11,347,466 | B2* | 5/2022 | Iversen | G09G 3/32 |
| 11,526,050 | B2* | 12/2022 | Chen | H10K 77/111 |
| 11,778,878 | B2* | 10/2023 | Yamazaki | H01L 25/0652 345/204 |
| 11,940,848 | B2* | 3/2024 | Gehlen | G06F 1/1656 |
| 2011/0298763 | A1* | 12/2011 | Mahajan | G09G 3/025 345/1.3 |
| 2016/0253935 | A1* | 9/2016 | Gerets | G09G 3/344 345/1.3 |
| 2020/0310736 | A1* | 10/2020 | Pastrik | G06F 1/1605 |
| 2023/0007792 | A1* | 1/2023 | Hyun | G09F 9/3026 |
| 2024/0256206 | A1* | 8/2024 | Seo | G06F 3/1446 |
| 2024/0258329 | A1* | 8/2024 | Lee | H10K 59/131 |

FOREIGN PATENT DOCUMENTS

KR  10-2020-0065383 A  6/2020

* cited by examiner

*Primary Examiner* — Vinh T Lam
(74) *Attorney, Agent, or Firm* — Birch, Stewart, Kolasch & Birch, LLP

(57) ABSTRACT

Discussed is a display device in which a photo transistor that senses light from a light-emitting element is disposed in a separate wiring substrate from a panel unit in which the light-emitting element is disposed. Thus, the photo transistor is used as a component of a compensation unit that compensates for a difference between luminance of pixels based on a sensing result of the light from the light-emitting element.

18 Claims, 17 Drawing Sheets

DISPLAY DEVICE

CROSS-REFERENCE TO RELATED APPLICATION

This application claims priority to Korean Patent Application No. 10-2023-0012883 filed on Jan. 31, 2023 in the Korean Intellectual Property Office, the entire contents of which are hereby expressly incorporated by reference into the present application.

BACKGROUND

Field

The present disclosure relates to a display device, and more particularly, to a display device in which a plurality of panel units are bonded onto a wiring substrate on which a link line is disposed.

Discussion of Related Art

Display devices are implemented in diverse forms such as televisions, monitors, smart phones, tablet PCs, laptops, and wearable devices.

Among the display devices, a light-emitting type display device can have a light-emitting element or light source built therein, and can display information using light generated from the built-in light-emitting element or light source.

As a variation, a light-emitting type display device can have a self-light-emitting element configured to emit light itself. The display device including such self-light-emitting element can be implemented to be thinner than the display device having the light source built therein, and can be flexible, folded, bent, or rolled.

The display device having the self-light-emitting element can include, for example, an organic light-emitting display device (also referred to herein as an OLED (Organic Light-Emitting Diode Display)) including a light-emitting layer made of an organic material, or a micro-LED display device (also referred to herein as a Micro LED (Micro Light-Emitting Diode Display)) or the like including a light-emitting layer made of an inorganic material.

The micro-LED display device includes the light-emitting layer made of the inorganic material that is resistant to moisture and oxygen, and thus has excellent reliability and a long lifespan compared to the display device including a light-emitting layer made of an organic material.

Further, a micro-LED element of the micro-LED display device not only lights up quickly, but also consumes smaller power and displays a high-luminance image. Thus, the micro-LED display device is advantageously applied to an extra-large screen.

SUMMARY OF THE DISCLOSURE

A display device can compensate for current and voltage using various schemes to compensate for changes in operation characteristics. For example, in addition to a thin-film transistor that drives a light-emitting element of the display device, a separate thin-film transistor for compensation for the current and voltage can be further added.

However, when the separate thin-film transistor for compensation for the current and voltage is further added on the substrate on which the light-emitting element and the thin-film transistor for driving the light-emitting element have been formed, a circuit configuration can become complicated such that the efficiency of the manufacturing process thereof can decrease.

Furthermore, in a transparent display device, there can be a limitation in that the area size of a circuit area can increase due to constituent circuits such as the thin-film transistor that is additionally disposed for compensation for the current and voltage, which in turn can reduce the area size of a transparent area of the transparent display device.

Accordingly, the inventors of the present disclosure have invented a display device with a compensation structure that can more efficiently and accurately compensate for changes in operation characteristics of the display device.

A technical purpose to be achieved according to one or more embodiments of the present disclosure is to provide a display device that can compensate for a difference between luminance of pixels based on a sensing result of light emitted from a light-emitting element.

A technical purpose to be achieved according to one or more embodiments of the present disclosure is to provide a display device in which a unit that senses light emitted from a light-emitting element can be used as a component of a sole compensation unit.

A technical purpose to be achieved according to one or more embodiments of the present disclosure is to provide a display device with a structure that can sense light emitted from a light-emitting element as effectively as possible.

A technical purpose to be achieved according to one or more embodiments of the present disclosure is to provide a display device that can increase process efficiency and space utilization of signal lines connected to a structure for sensing light emitted from a light-emitting element.

Purposes according to the present disclosure are not limited to the above-mentioned purposes and objects. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims or combinations thereof.

A display device according to an embodiment of the present disclosure includes a plurality of panel units, each including at least one light-emitting element; and a wiring substrate including: a plurality of link lines for transmitting a line signal to the panel unit; and a plurality of photo transistors for sensing light emitted from the light-emitting elements, wherein the plurality of panel units are bonded onto the wiring substrate in a tiling manner.

According to one embodiment of the present disclosure, a vertical level of the photo transistor is higher than a vertical level of the light-emitting element, wherein at least one overcoat layer or at least one spacer is disposed between the photo transistor and the light-emitting element.

Furthermore, according to one embodiment of the present disclosure, signal lines connected to the photo transistor can be formed integrally with the link line for transmitting the line signal to the panel unit or can be positioned in the same layer as a layer in which the link line for transmitting the line signal to the panel unit.

According to an embodiment of the present disclosure, the photo transistor that senses the light from the light-emitting element is disposed in the separate wiring substrate from the panel unit in which the light-emitting element is disposed. Thus, the photo transistor can be used as a component of a compensation unit that can compensate for a difference between the luminance of the pixels based on a sensing result of the light from the light-emitting element.

Furthermore, according to an embodiment of the present disclosure, the photo transistor can be formed in the wiring substrate which is physically distinguished from the panel unit in a separate process from a formation process of the panel unit, and then, the plurality of panel units can be bonded to the wiring substrate in a tiling manner. Thus, the photo transistor PHT with characteristics of high reliability can be easily used as a component of a sole compensation unit.

Furthermore, according to an embodiment of the present disclosure, a vertical level of the photo transistor is higher than a vertical level of the light-emitting element, and at least one overcoat layer or at least one spacer is disposed between the photo transistor and the light-emitting element. Thus, a minimum angle at which the photo transistor can most effectively sense the light from the light-emitting element can be secured.

Furthermore, according to an embodiment of the present disclosure, the signal lines connected to the photo transistor can be formed integrally with the link line for transmitting the line signal to the panel unit or can be positioned in the same layer as a layer in which the link line for transmitting the line signal to the panel unit. Thus, process efficiency and space utilization for the formation of the signal lines connected to a structure that senses the light emitted from the light-emitting element can be increased such that the process optimization effect can be achieved.

Further, according to an embodiment of the present disclosure, the plurality of panel units can be bonded onto the wiring substrate in a tiling manner, thereby minimizing the bezel area, and thus substantially preventing the boundary between the panel units from being visually recognized.

Further, according to an embodiment of the present disclosure, the plurality of panel units can be bonded onto the wiring substrate in a tiling manner, thereby freely and easily implementing a display device having a large screen of various sizes and shapes.

Further, according to an embodiment of the present disclosure, the plurality of panel units, each including a plurality of signal lines can be disposed on the wiring substrate including the plurality of link lines. In this regard, the link lines and the signal lines can overlap each other. Thus, transmittance of a transparent display device can be improved.

Effects of the present disclosure are not limited to the effects mentioned above, and other effects not mentioned will be clearly understood by those skilled in the art from the descriptions below.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
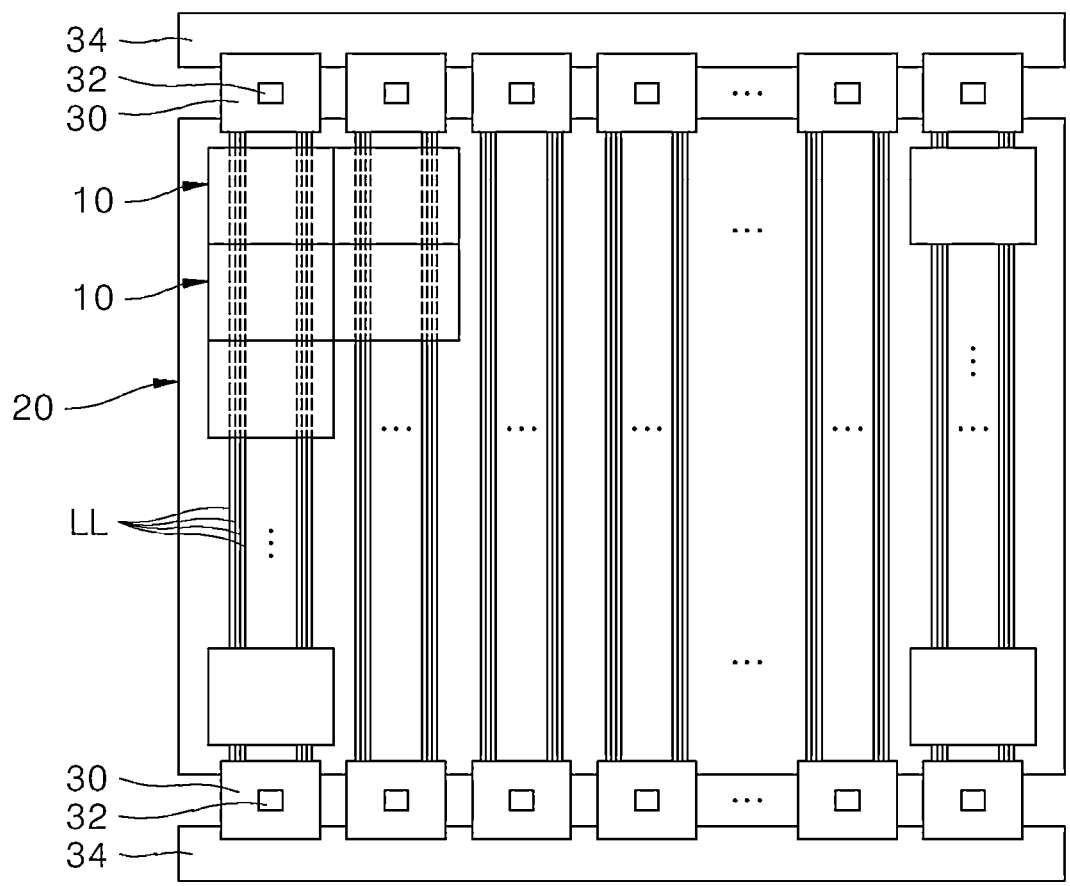
FIG. 1 is a schematic plan view of a display device according to an embodiment of the present disclosure.
Figure 2:
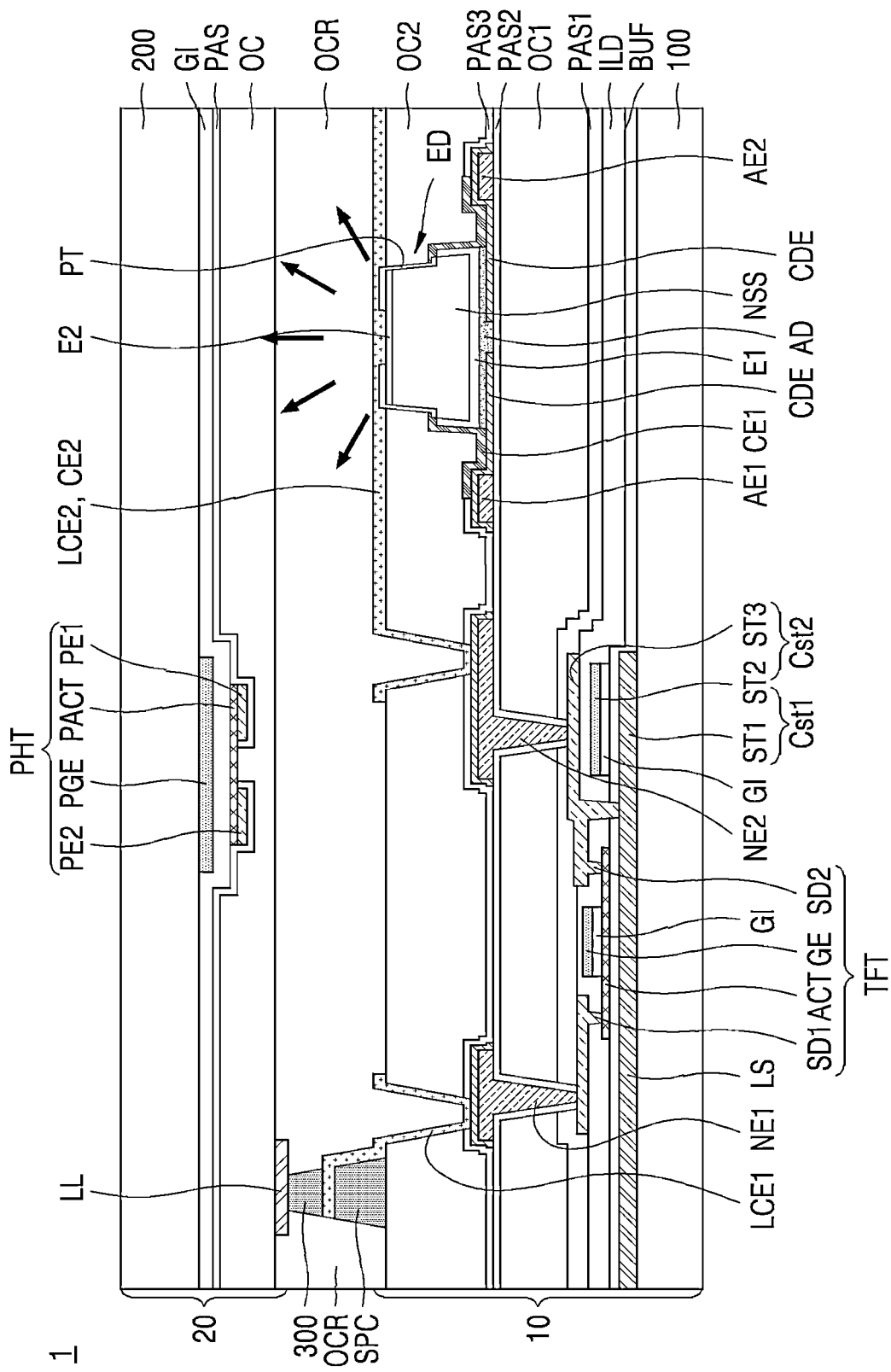
FIG. 2 is a cross-sectional view corresponding to one sub-pixel in a state in which a wiring substrate and a panel unit are bonded to each other according to a first embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but can be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

A shape, a size, a ratio, an angle, a number, etc., disclosed in the drawings for illustrating embodiments of the present disclosure are illustrative, and the present disclosure is not limited thereto.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer or other layers/elements being disposed between the first and second elements or layer s.

It will be understood that when an element or layer is referred to as being "connected to", or "connected to" another element or layer, it can be directly on, connected to, or connected to the other element or layer, or one or more intervening elements or layer s can be present. In addition, it will also be understood that when an element or layer is referred to as being "between" two elements or layer s, it can be the only element or layer between the two elements or layer s, or one or more intervening elements or layer s can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

When a certain embodiment can be implemented differently, a function or an operation specified in a specific block can occur in a different order from an order specified in a flowchart. For example, two blocks in succession can be actually performed substantially concurrently, or the two blocks can be performed in a reverse order depending on a function or operation involved.

It will be understood that, although the terms "first", "second", "third", and so on can be used herein to describe various elements, components, regions, layer s and/or sections, these elements, components, regions, layer s and/or sections should not be limited by these terms. These terms are used to distinguish one element, component, region, layer or section from another element, component, region, layer or section, and may not define order or sequence. Thus, a first element, component, region, layer or section described under could be termed a second element, component, region, layer or section, without departing from the spirit and scope of the present disclosure.

Spatially relative terms, such as "beneath," "below," "lower," "under," "above," "upper," and the like, can be used herein for ease of illustration to illustrate one element or feature's relationship to another element or feature as illustrated in the figures. It will be understood that the spatially relative terms are intended to encompass different orientations of the device in use or in operation, in addition to the orientation depicted in the figures. For example, when the device in the drawings can be turned over, elements described as "below" or "beneath" or "under" other elements or features would then be oriented "above" the other elements or features. Thus, the example terms "below" and "under" can encompass both an orientation of above and below. The device can be otherwise oriented, for example, rotated 90 degrees or at other orientations, and the spatially relative descriptors used herein should be interpreted accordingly.

The features of the various embodiments of the present disclosure can be partially or entirely combined with each other, and can be technically associated with each other or operate with each other. The embodiments can be implemented independently of each other and can be implemented together in an association relationship.

In interpreting a numerical value, the value is interpreted as including an error range unless there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. For example, unless otherwise stated or clear from the context, the expression that 'x uses a or b' means any one of natural inclusive permutations.

The terms used in the description below have been selected as being general and universal in the related technical field. However, there can be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term can be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, with reference to FIG. 1 to FIG. 20, a display device according to various embodiments of the present disclosure will be described in detail. All the components of each display device according to all embodiments of the present disclosure are operatively coupled and configured.

Referring to FIG. 1 to FIG. 5, a display device 1 according to a first embodiment and a second embodiment of the present disclosure is described.

Panel units 10, each including a plurality of signal lines SL, can be bonded onto a wiring substrate 20 including a plurality of link lines LL in a tiling scheme.

The wiring substrate 20 can include a second substrate 200 supporting the plurality of link lines LL thereon.

The second substrate 200 can be embodied as an insulating substrate, and can be made of, for example, glass or a transparent plastic material to implement a transparent display device.

One or more circuit films 30 can be disposed at one side or both opposing sides of the second substrate 200 so as to be electrically connected to the plurality of link lines LL.

The circuit film 30 can be embodied as a flexible circuit film, and a data driver 32 can be disposed on each circuit film 30 in a chip on film (COF) scheme. However, the present disclosure is not limited thereto.

One or more printed circuit boards 34 can be electrically connected to the other side of the circuit film 30 opposite to one side of the circuit film 30 connected to the second substrate 200.

The printed circuit board 34 can be embodied as a flexible printed circuit board (FPCB).

For example, the printed circuit board 34 can include a source printed circuit board and a control printed circuit board.

In this case, the source printed circuit board and the control printed circuit board can be connected to each other using a flat flexible cable (FFC). However, the present disclosure is not limited thereto.

A power management circuit, a timing controller, a level shifter, and the like can be disposed in the printed circuit board 34.

The power management circuit can generate and output various operation voltages required for all circuit components of the display device 1 using an input voltage supplied from an external source.

The timing controller can receive image data and input timing control signals from an external host system, and then supply a plurality of data control signals and the image data to a data driver 32, and supply a plurality of gate control signals to a gate driver.

The data driver 32 can receive the plurality of data control signals and the image data from the timing controller, convert the same into a data signal, and supply a data voltage to a data signal line.

The gate driver can receive the plurality of gate control signals from the timing controller via a level shifter, convert the same into a gate signal (scan signal), and supply a gate voltage (e.g., a scan voltage) to a gate signal line.

For example, the gate driver can be mounted in the panel unit 10 in a gate-in-panel (GIP) scheme. However, the present disclosure is not limited thereto.

Various voltages and line signals generated in this way can be transferred to the link lines LL of the wiring substrate 20 via the circuit film 30.

The plurality of link lines LL can be arranged along one direction and spaced apart from each other.

For example, the plurality of link lines LL can include a plurality of high-potential voltage (Evdd) link lines, a plurality of low-potential voltage (Evss) link lines, a plurality of data voltage (Data) link lines, a plurality of initialization voltage (Ini) link lines, a plurality of reference voltage (Ref) link lines, and a plurality of scan (Scan) link lines Scan.

In this case, the plurality of data voltage (Data) link lines can include a first data voltage (Data1) link line, a second data voltage (Data2) link line, and a third data voltage (Data3) link line.

The plurality of link lines LL disposed on the wiring substrate 20 can be electrically connected to the plurality of signal lines SL disposed on the panel unit 10, respectively.

For example, the plurality of signal lines SL can include a plurality of high-potential voltages (Evdd) signal lines, a plurality of low-potential voltage (Evss) signal lines, a plurality of data voltage (Data) signal lines, a plurality of reference voltage (Ref) signal lines, a plurality of initialization voltage (Ini) signal lines, and a plurality of scan (Scan) signal lines.

In this case, the plurality of data voltage (Data) signal lines can include a first data voltage (Data1) signal line, a second data voltage (Data2) signal line, and a third data voltage (Data3) signal line.

Various voltages and line signals transmitted via the link line LL in this way can be supplied to the pixel via the signal line SL.

The plurality of panel units 10, each including the plurality of signal lines SL, can be provided in a modular form and can be bonded onto the wiring substrate 20 in a tiling scheme in which the plurality of panel units 10 are bonded on the wiring substrate 20 in a tile form, thereby realizing a tiling display device.

For example, the plurality of panel units 10 can be disposed on the wiring substrate 20 and can be arranged in a matrix form along a plurality of rows and a plurality of columns and can be bonded to the wiring substrate 20.

In this case, the plurality of panel units 10 can be arranged so that the signal lines SL of the panel unit 10 overlap with the link lines LL of the wiring substrate 20 in the vertical direction. Thus, a reduction of a transmissive area due to the various lines can be minimized. Thus, when the display device 1 according to an embodiment of the present disclosure is implemented as a transparent display device, transmittance can be improved.

Further, in the display device 1 according to an embodiment of the present disclosure, the plurality of panel units 10 can be boned onto the wiring substrate 20 in the tiling manner. Thus, the display device 1 having a screen of various sizes and shapes can be freely implemented by changing the number and arrangement of the panel units 10 bonded onto the wiring substrate 20.

In particular, the number of the panel units 10 can be freely increased. Thus, there is an advantage in that a large screen can be more easily implemented.

Further, in the display device 1 according to an embodiment of the present disclosure, a non-display area can be minimized.

For example, a spacing between the outermost light-emitting element of one panel unit 10 and the outermost light-emitting element of another panel unit 10 adjacent thereto can be identical to a spacing between adjacent light-emitting elements in one panel unit 10.

Accordingly, the display device 1 according to an embodiment of the present disclosure can minimize the non-display area, and furthermore, a zero-bezel display device 1 in which a bezel area is substantially zero can be realized.

Further, in the display device 1 according to an embodiment of the present disclosure, the plurality of panel units 10 can be disposed on the wiring substrate 20, and thus the plurality of panel units 10 can be freely attached to and detached from the wiring substrate 20.

Accordingly, in the display device 1 according to an embodiment of the present disclosure, when a defect occurs in a specific panel unit 10, only the defective panel unit 10 can be removed from the wiring substrate 20 and can be replaced with a normal panel unit. Thus, an easier and faster repair process can be achieved.

Further, in the display device 1 according to an embodiment of the present disclosure, each of the plurality of link lines LL disposed on the wiring substrate 20 can function as an auxiliary line for the signal line SL which is disposed in the panel unit 10.

The plurality of link lines LL can be arranged in parallel with each other so as to overlap the plurality of signal lines SL of the panel unit 10 in the vertical direction. Each of the plurality of link lines LL can be electrically connected to each of the plurality of signal lines SL via a contact member 300.

Therefore, the display device 1 according to an embodiment of the present disclosure can lower the electrical resistance of the plurality of signal lines SL. Thus, signal delay such as RC delay and luminance uniformity deterioration due to voltage drop can be reduced. Thus, a low power and high luminance display device can be implemented.

Figure 10:
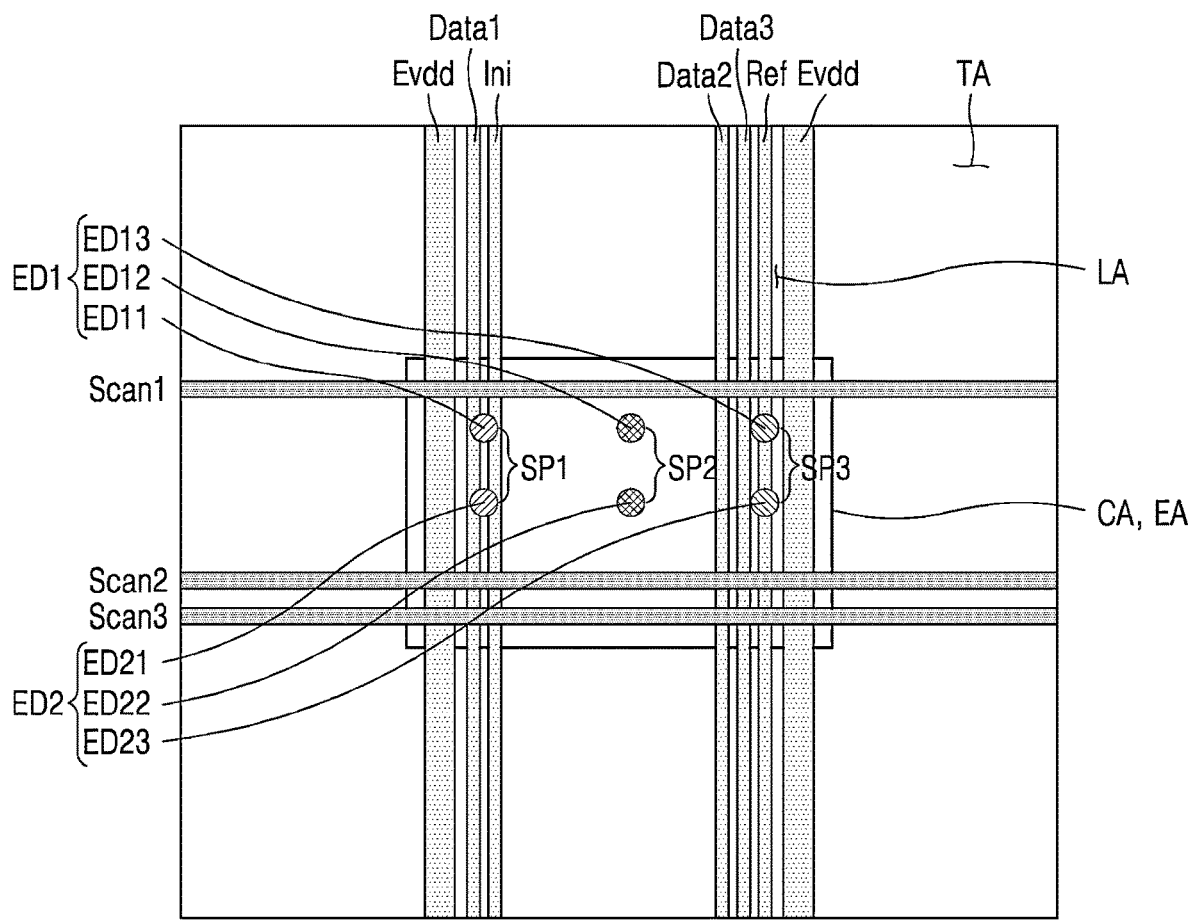
FIG. 10 is a plan view of a panel unit of a transparent display device according to one embodiment of the present disclosure.
Figure 11:
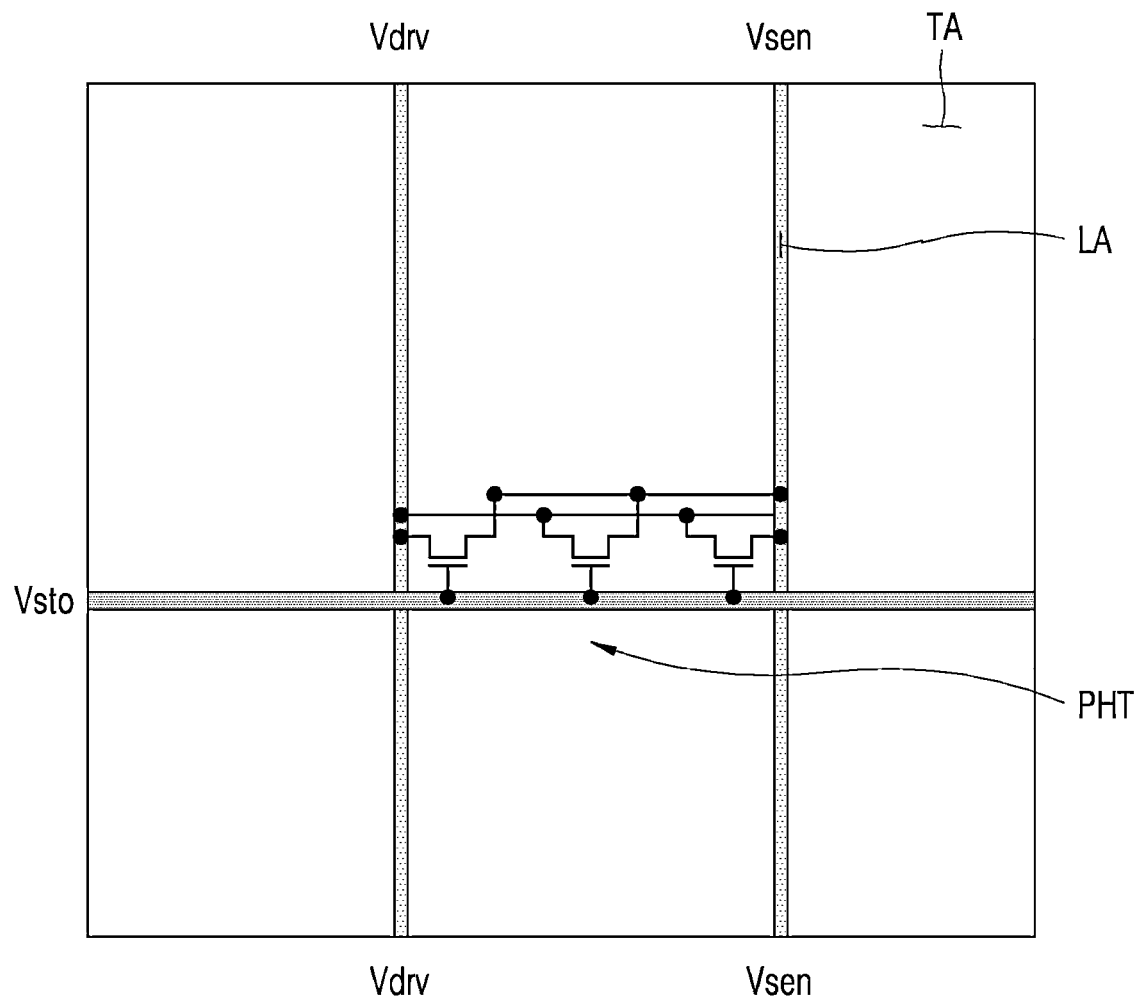
FIG. 11 is a circuit connection diagram of a wiring substrate of a transparent display device according to one embodiment of the present disclosure.
Figure 12:
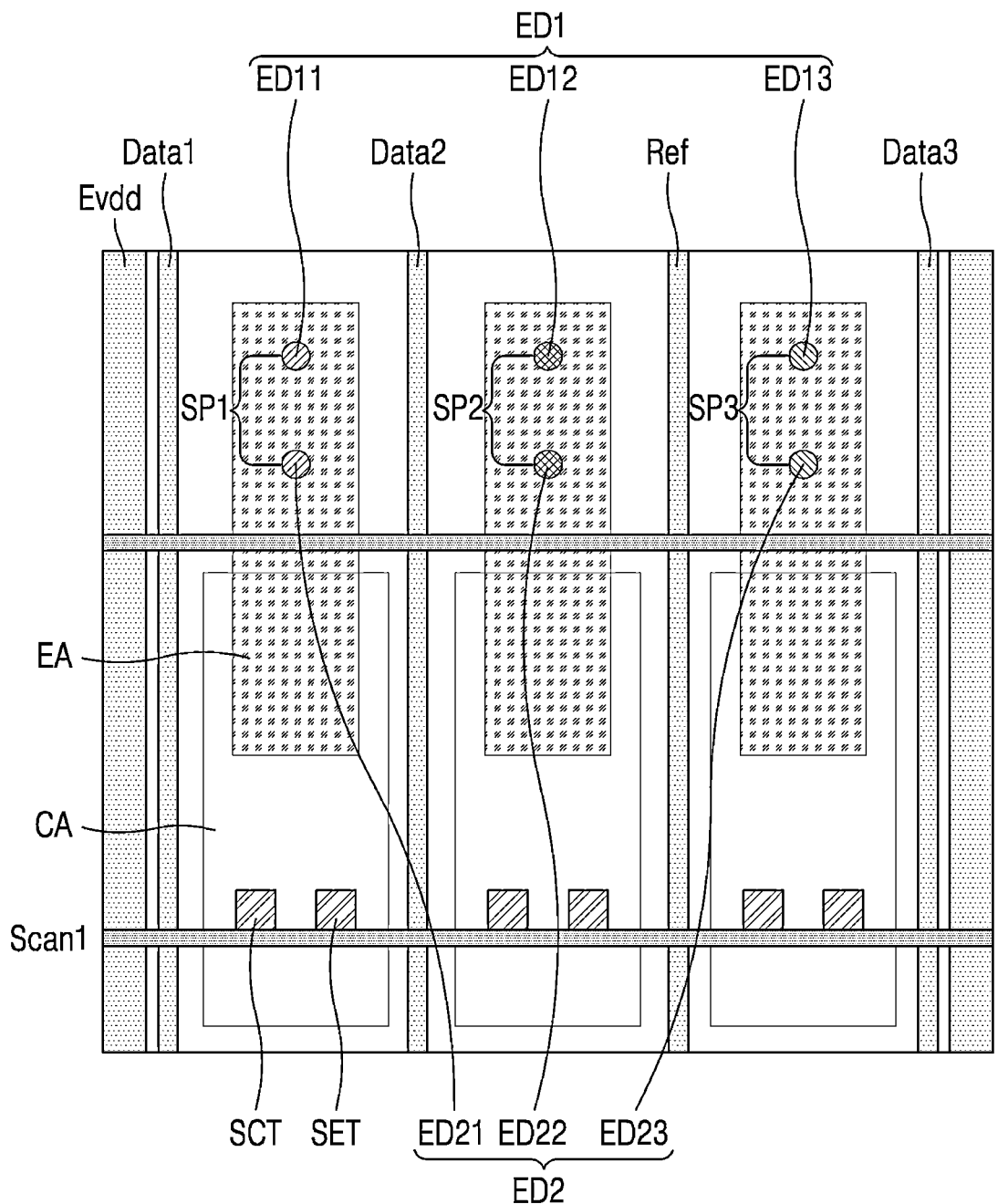
FIG. 12 is a plan view of a panel unit of a display device according to one embodiment of the present disclosure.
Figure 13:
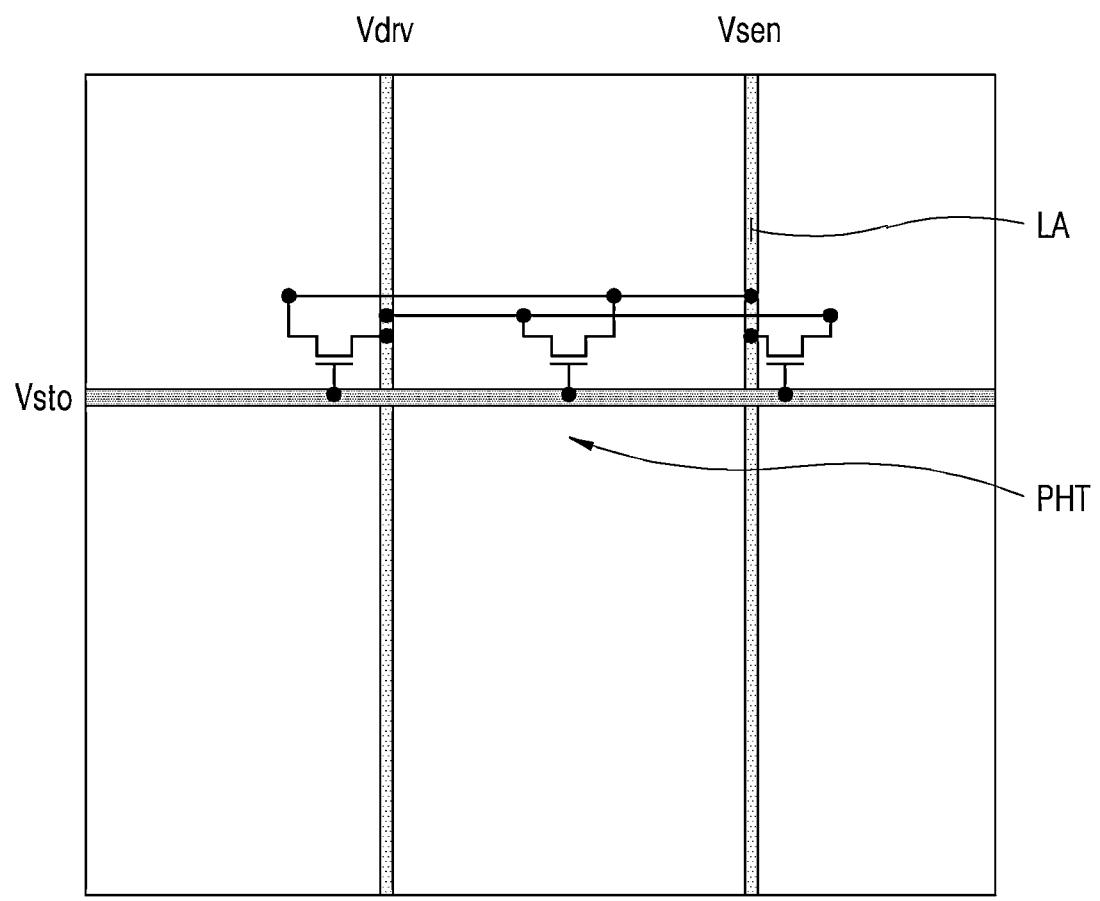
FIG. 13 is a circuit connection diagram of a wiring substrate of a display device according to one embodiment of the present disclosure.

With further reference to FIG. 10 and FIG. 12, FIG. 10 is a plan view of a transparent display device showing a portion corresponding to one pixel P, and FIG. 12 is a plan view of a display device showing a portion corresponding to one pixel P.

In one example, the panel unit 10 can include a plurality of pixels P.

Each of the plurality of pixels P can include a first sub-pixel SP1, a second sub-pixel SP2, and a third sub-pixel SP3.

The first sub-pixel SP1, the second sub-pixel SP2, and the third sub-pixel SP3 can emit light of different colors.

For example, the first sub-pixel SP1, the second sub-pixel SP2, and the third sub-pixel SP3 can be respectively a red sub-pixel emitting light of a red color (R), a green sub-pixel emitting light of a green color (G), and a blue sub-pixel emitting light of a blue color (B). However, the present disclosure is not limited thereto.

For example, each of the plurality of pixels P can further include a white sub-pixel emitting light of a white color (W).

Each of the plurality of sub-pixels SP1, SP2, and SP3 can include a light-emitting area EA and a circuit area CA.

In the light-emitting area EA of the panel unit 10, a plurality of light-emitting elements ED including a plurality of first light-emitting elements ED1 and a second light-emitting elements ED2 can be disposed.

The present disclosure describes an example in which the light-emitting element ED is embodied as a micro-LED. However, the present disclosure is not limited thereto.

The first light-emitting element ED1 can include a first light-emitting element ED11 emitting light of a first color, a first light-emitting element ED12 emitting light of a second color, and a first light-emitting element ED13 emitting light of a third color.

Furthermore, the second light-emitting element ED2 can include a second light-emitting element ED21 emitting light of the first color, a second light-emitting element ED22 emitting light of the second color, and a second light-emitting element ED23 emitting light of a third color.

For example, a pair of the first light-emitting element ED1 and the second light-emitting element ED2 that emit light of the same color can constitute one sub-pixel.

A defect can occur in the first light-emitting element ED1 during a process of forming the panel unit 10, resulting in the first light-emitting element ED1 not emitting light properly.

In order to deal with this situation, the display device 1 according to an embodiment of the present disclosure can have a redundancy structure in which a plurality of light-emitting elements emitting light of the same color are disposed in one sub-pixel.

Therefore, the first light-emitting element ED1 can act as a main light-emitting element, and the second light-emitting element ED2 can act as a redundant light-emitting element.

Referring to FIG. 10, the light-emitting area EA and the circuit area CA can be disposed in an area where the scan voltage signal lines Scan1, Scan2, Scan3 and the various signal lines Evdd, data1, data2, data3, Ini, Ref, and Evss intersect with each other.

In the circuit area CA, a driving circuit including various types of thin-film transistors TFT such as a scan thin-film transistor SCT, a sensing thin-film transistor SET, and a storage capacitor can be disposed.

An area where the various signal lines Evdd, data1, data2, data3, Ini, Ref, and Evss are disposed can be defined as a line area LA.

Areas excluding the light-emitting area EA, the circuit area CA, and the line area LA can belong to a transmissive area TA.

In the transparent display device, an arrangement density of the light-emitting area EA, the circuit area CA, and the line area LA can be high to secure a larger area size of the transmissive area TA.

Referring to FIG. 12, a general display device does not require the transmissive area TA. Thus, in the general display device, the arrangement density of the light-emitting area EA, the circuit area CA, and the line area LA can be not high, but the light-emitting area EA, the circuit area CA, and the line area LA can be arranged as sparsely as possible while taking into account interference between lines and electrodes.

The wiring substrate 20 can include a plurality of photo transistors PHT that sense light emitted from the light-emitting element ED disposed in the panel unit 10.

The display device 1 according to the present disclosure can include the photo transistor PHT that outputs an off-current in response to light emitted from the light-emitting element ED in a turned-off state. Thus, the light from the light-emitting element ED located in a specific pixel can be sensed based on a detection result of the off-current output from the photo transistor PHT.

The photo transistor PHT can include a photo gate electrode PGE, a photo active layer PACT, a first photo electrode PE1, and a second photo electrode PE2.

A photo control signal Vsto can be applied to the photo gate electrode PGE, a photo driving signal Vdrv can be applied to the first photo electrode PE1, and a photo sensing signal Vsen can be output from the second photo electrode PE2.

Therefore, the photo gate electrode PGE can be electrically connected to a photo control signal line that applies the photo control signal Vsto, and the first photo electrode PE1 can be electrically connected to a photo driving signal line which applies the photo driving signal Vdrv. The second photo electrode PE2 can be electrically connected to a photo sensing signal line that applies the photo sensing signal Vsen.

For example, when the light is incident into the photo transistor PHT in a state in which a low level photo control signal Vsto voltage is applied to the photo gate electrode PGE of the photo transistor PHT, and a high level photo driving signal Vdrv voltage is applied to the first photo electrode PE1, the photo transistor PHT can output the off-current.

The second photo electrode PE2 of the photo transistor PHT can be electrically connected to sensing circuitry that processes a sensing signal via a readout line ROL.

For example, the sensing circuitry can include an amplifier electrically connected to the readout line ROL, an integrator that integrates an output signal of the amplifier and outputs an integrated value, a sample-and-hold circuit that stores therein the integrated value of the integrator, and an analog-to-digital converter that converts the sensing signal into a digital signal.

The sensing circuitry can convert the detected sensing signal received via the readout line ROL into the digital signal as sensing data, and can output the sensing data to a sensing controller.

In one example, the sensing circuitry and the data driver 32 can be manufactured into a single IC (Integrated Circuit) which can be disposed in the display device 1.

The wiring substrate 20 and the plurality of panel unit 10 can be bonded to each other via an optical resin layer OCR disposed between the wiring substrate 20 and the plurality of panel units 10, and can be electrically connected to each other via a plurality of conductive contact members 300.

For example, the optical resin layer OCR can include optically clear resin (OCR).

In the display device 1 according to an embodiment of the present disclosure as described above, the photo transistor PHT sensing the light emitted from the light-emitting element ED can be included in the wiring substrate 20 in a separate manner from the panel unit 10 in which the light-emitting element ED is included. Thus, the photo transistor PHT can be used as a component of a compensation unit that can compensate for a difference between luminance of the pixels based on the sensing result of the light by the photo transistor PHT.

In this way, the compensation unit can compensate for the difference between luminance of the pixels based on the sensing result of the light emitted from the light-emitting element ED using the photo transistor PHT. Thus, the display device 1 can correct the sensed current and voltage at the thin-film transistor that drives the light-emitting element ED in order to compensate for the difference between luminance of the pixels. Thus, the display device 1 can have more accurate image quality.

Furthermore, in the display device 1 according to an embodiment of the present disclosure, the photo transistor PHT can be formed in the wiring substrate 20 which is physically distinguished from the panel unit 10 in a separate process from a formation process of the panel unit 10, and then, the plurality of panel units 10 can be bonded to the wiring substrate 20 in a tiling manner. Thus, the photo transistor PHT with characteristics of high reliability can be easily used as a component of a sole compensation unit.

As the photo transistor PHT with characteristics of high reliability can be used as the component of the sole compensation unit, the photo transistor PHT can be used for purposes such as external compensation or camera compensation.

Hereinafter, various connection structures between the wiring substrate 20 and the panel unit 10 will be described with reference to a cross-sectional view of one sub-pixel in a state in which the wiring substrate 20 and the panel unit 10 are bonded to each other.

Hereinafter, the panel unit 10 will be described first, and then the wiring substrate 20 will be described.

The panel unit 10 can include a first substrate 100, a thin-film transistor TFT disposed on the first substrate 100, a storage capacitor Cst, and various lines.

The first substrate 100 can be made of a transparent material including glass or plastic.

A light-blocking layer LS can be disposed on the first substrate 100 so as to prevent light incident from a position under the first substrate 100 from invading an active layer ACT of the thin-film transistor TFT, such that leakage current can be reduced.

A buffer layer BUF can be disposed on the light-blocking layer LS so as to block impurities or moisture passing through the first substrate 100.

The thin-film transistor TFT can be disposed on the buffer layer BUF.

The thin-film transistor TFT can act as a driving thin-film transistor that provides a driving signal for driving the light-emitting element ED.

The thin-film transistor TFT can include the active layer ACT, a first source/drain electrode SD1, a second source/drain electrode SD2, and a gate electrode GE.

A gate insulating layer GI can be disposed between the active layer ACT and the gate electrode GE.

An interlayer insulating layer ILD can be disposed on the active layer ACT and the gate electrode GE. The interlayer insulating layer ILD can have a pair of contact-holes defined therein respectively exposing source and drain areas of the active layer ACT.

The first source/drain electrode SD1 and the second source/drain electrode SD2 can be disposed on the interlayer insulating layer ILD, and can be electrically connected to the active layer ACT via the pair of contact-holes, respectively.

The first source/drain electrode SD1 can act as a source electrode, and the second source/drain electrode SD2 can act as a drain electrode.

The first data (Data1) signal line, the second data (Data2) signal line, and the third data (Data3) signal line as the signal lines SL formed in the panel unit 10, and the first source/drain electrode SD1 and the second source/drain electrode SD2 can be made of the same material and can be disposed in the same layer. The first data (Data1) signal line, the second data (Data2) signal line, and the third data (Data3) signal line as the signal lines SL formed in the panel unit 10 can be electrically connected to the first source/drain electrode SD1 and the second source/drain electrode SD2.

The storage capacitor Cst can be spaced apart from the thin-film transistor TFT, and can include a first storage capacitor Cst1 and a second storage capacitor Cst2.

The storage capacitor Cst can store a voltage therein so that the light-emitting element ED continuously maintains the same state for one frame.

The first storage capacitor Cst1 can include a first capacitor electrode ST1 and a second capacitor electrode ST2, while the second storage capacitor Cst2 can include the second capacitor electrode ST2 and a third capacitor electrode ST3.

The first capacitor electrode ST1 can be integrally formed with the light-blocking layer LS.

The second capacitor electrode ST2 can be disposed on the first capacitor electrode ST1, and the second capacitor electrode ST2 can be made of the same material as a material of the gate electrode GE.

The buffer layer BUF and the gate insulating layer GI can be disposed between the first capacitor electrode ST1 and the second capacitor electrode ST2 and thus can act as a dielectric layer constituting the first storage capacitor Cst1.

The third capacitor electrode ST3 can be integrally formed with the second source/drain electrode SD2.

The second source/drain electrode SD2 can be electrically connected to the light-blocking layer LS via a contact-hole extending through the buffer layer BUF and the interlayer insulating layer ILD.

The interlayer insulating layer ILD can be disposed between the second capacitor electrode ST2 and the third capacitor electrode ST3 and can act as a dielectric layer constituting the second storage capacitor Cst2.

A first passivation layer PAS1 can be formed to cover the thin-film transistor TFT.

The first passivation layer PAS1 can serve to prevent penetration of impurities or moisture into the thin-film transistor TFT.

A first overcoat layer OC1 can be formed on the first passivation layer PAS1.

The first overcoat layer OC1 can act as a first planarization layer, and can serve to reduce a step caused by a lower line such as the thin-film transistor TFT so as to planarize a top surface.

The first overcoat layer OC1 can include an organic material, for example, a photoactive compound (PAC). However, the present disclosure is not limited thereto.

A pair of via-holes or a pair of contact-holes respectively exposing portions of surfaces of the first source/drain electrode SD1 and the second source/drain electrode SD2 can extend through the first overcoat layer OC1 and the first passivation layer PAS1.

A second passivation layer PAS2 including an insulating material can be disposed on the first overcoat layer OC1. The second passivation layer PAS2 can extend along and on an inner side surface of each of the pair of via-holes extending through the first overcoat layer OC1 and the first passivation layer PAS1.

However, the second passivation layer PAS2 can be formed in a pattern so as to expose portions of the surfaces of the first source/drain electrode SD1 and the second source/drain electrode SD2.

A first source/drain connection electrode NE1 and a second source/drain connection electrode NE2 can be disposed on the second passivation layer PAS2. The first source/drain connection electrode NE1 can be electrically connected to the first source/drain electrode SD1 via one of the pair of via-holes, while the second source/drain connection electrode NE2 can be electrically connected to the second source/drain electrode SD2 via the other of the pair of via-holes.

The first source/drain electrode SD1 and the first source/drain connection electrode (NE1) can be interchangeable with each other in terms of a name. Likewise, the second source/drain electrode SD2 and the second source/drain connection electrode NE2 can be interchangeable with each other in terms of a name.

The light-emitting element ED can be disposed on the second passivation layer PAS2.

The present disclosure describes an example in which the light-emitting element ED is directly bonded onto the panel unit 10 in a self-assembly scheme. However, the present disclosure is not limited thereto.

In this case, the panel unit 10 can function as a self-assembly substrate capable of fixing the first light-emitting element ED1 thereto in a self-assembly scheme. The panel unit 10 can have a self-assembly structure.

A first assembly electrode AE1, a second assembly electrode AE2, a clad electrode layer CDE, a first line electrode CE1, and an adhesive layer AD can be formed on the second passivation layer PAS2.

The first assembly electrode AE1 and the second assembly electrode AE2 can be spaced apart from each other and can correspond to each of a plurality of light-emitting elements ED assembled in a self-assembly process.

Each of the assembly electrodes AE1 and AE2 can include a transparent electrode material including indium-tin-oxide (ITO).

The first assembly electrode AE1 and the second assembly electrode AE2 can generate an electric field therebetween when voltage is applied thereto in the self-assembly process. Thus, the light-emitting element ED which has moved into an assembly space defined between the first assembly electrode AE1 and the second assembly electrode AE2 can be stably fixed therein.

The clad electrode layer CDE can be formed on the first assembly electrode AE1 and the second assembly electrode AE2. The clad electrode layer CDE can cover the first assembly electrode AE1 and the second assembly electrode AE2.

The first assembly electrode AE1 and the second assembly electrode AE2, and the first source/drain connection electrode NE1 and the second source/drain connection electrode NE2 can be made of the same material and can be disposed in the same layer.

The clad electrode layer CDE can be also formed on the first source/drain connection electrode NE1 and the second source/drain connection electrode NE2. The clad electrode layer CDE can be disposed to cover the first source/drain connection electrode NE1 and the second source/drain connection electrode NE2.

The clad electrode layer CDE can prevent corrosion of the first assembly electrode AE1 and the second assembly electrode AE2 in the self-assembly process carried out in fluid, such that the electric field for the assembly of the light-emitting element ED can be generated easily.

The clad electrode layer CDE can include copper (Cu).

A spacing between a pair of clad electrode layers CDE respectively formed on the first assembly electrode AE1 and the second assembly electrode AE2 can be smaller than a spacing between the first assembly electrode AE1 and the second assembly electrode AE2.

Accordingly, an assembly position of the light-emitting element ED disposed in the assembly space formed between the first assembly electrode AE1 and the second assembly electrode AE2 can be more accurately fixed.

A third passivation layer PAS3 can be disposed on the clad electrode layer CDE.

A portion of the third passivation layer PAS3 can cover a partial area of a top face of the clad electrode layer CDE while a remaining portion of the third passivation layer PAS3 can cover an entire surface of the first substrate 100.

The third passivation layer PAS3 can be formed not to cover an area corresponding to the assembly space formed between the first assembly electrode AE1 and the second assembly electrode AE2 so as to be exposed.

The assembly space formed in this way can designate a position to which the light-emitting element ED is fixed.

The adhesive layer AD can be disposed on a portion of the clad electrode layer CDE corresponding to the assembly space, and the adhesive layer AD can serve to adhesively fix the light-emitting element ED to the clad electrode layer.

The adhesive layer AD can be made of a thermally-curable material or an optically-curable material. However, the present disclosure is not limited thereto.

The light-emitting element ED can be disposed on the adhesive layer AD.

The present disclosure describes an example in which the light-emitting element ED is embodied as a vertical micro-LED. However, the present disclosure is not limited thereto, and the light-emitting element ED can be embodied as a horizontal micro-LED.

Alternatively, the light-emitting element ED can be embodied as a micro-LED having a flip chip shape or a micro-LED having a nanorod shape.

The light-emitting element ED can include a semiconductor structure NSS, a first electrode E1, and a second electrode E2.

The first electrode E1 of the light-emitting element ED can act as a first cathode electrode, and the second electrode E2 thereof can act as a first anode electrode.

The semiconductor structure NSS can be embodied as a nitride semiconductor structure, and can include a first semiconductor layer, an active layer disposed on one side of the first semiconductor layer, and a second semiconductor layer.

The first electrode E1 can be disposed on one surface of the first semiconductor layer where the active layer is not disposed, while the second electrode E2 can be disposed on one surface of the second semiconductor layer where the active layer is not disposed.

For example, the first electrode E1 can be formed to extend along and on one surface of the first semiconductor layer and along and on a portion of a side surface of the first semiconductor layer.

The first semiconductor layer can be configured for supplying electrons to the active layer, and can include a nitride semiconductor containing first conductivity type impurities. For example, the first conductivity-type impurity can include an N-type impurity.

The active layer can include a Multi-Quantum-Well (MQW) structure. The second semiconductor layer can be configured for injecting holes into the active layer, and can include a nitride semiconductor containing second conductivity type impurities.

For example, the second conductivity type impurity can include a P type impurity.

A protective layer pattern PT can be formed to cover at least a portion of an outer surface of the light-emitting element ED.

The protective layer pattern PT can serve to prevent damage that can occur to a side surface of the semiconductor structure NSS in a dry etching process to form the semiconductor structure NSS, thereby supplementing the characteristics of the element.

The other surface of the first semiconductor layer opposite to one surface of the first semiconductor layer on which the active layer is disposed can contact the adhesive layer AD such that the light-emitting element ED can be fixed to the adhesive layer AD.

A first line electrode CE1 disposed to surround the first electrode E1 can be formed on a side surface of the light-emitting element ED and can contact and be electrically connected to the first electrode E1.

One side of the first line electrode CE1 can cover the clad electrode layer CDE, and can contact and be electrically connected to the clad electrode layer CDE.

Further, a second line electrode CE2 can be formed on the first light-emitting element ED, and can contact and be electrically connected to the second electrode E2.

A second overcoat layer OC2 can be formed to cover the light-emitting element ED.

The second overcoat layer OC2 can act as a second planarization layer, and can serve to reduce a step caused by an underlying element such as the light-emitting element ED to provide a planarized top surface.

The second overcoat layer OC2 can include an organic material, for example, a photoactive compound (PAC). However, the present disclosure is not limited thereto.

A first line connection electrode LCE1 and a second line connection electrode LCE2 can be formed on the second overcoat layer OC2.

The second line electrode CE2 as described above can be referred to as the second line connection electrode LCE2.

The first line connection electrode LCE1 and the second line connection electrode LCE2 can be made of the same material and can be disposed in the same layer.

Each of a pair of contact-holes can extend through the second overcoat layer OC2 and the third passivation layer PAS3 so as to expose a portion of a surface of the clad electrode layer CDE disposed on each of the first source/drain connection electrode NE1 and the second source/drain connection electrode NE2.

Further, the second overcoat layer OC2 can be formed not to cover at least a portion of a surface of the second electrode E2 of the light-emitting element ED so as to be exposed.

Accordingly, the first line connection electrode LCE1 can be electrically connected to the first source/drain connection electrode NE1 via a portion of the clad electrode layer CDE exposed to an outside through one of the contact-holes. The second line connection electrode LCE2 can be electrically connected to the second source/drain connection electrode NE2 via a portion of the clad electrode layer CDE exposed to the outside through the other of the contact-holes.

In this case, the second line connection electrode LCE2 having one side electrically connected to the second source/drain connection electrode NE2 can cover a top face of the light-emitting element ED so as to be electrically connected to the second electrode E2.

Accordingly, the second line connection electrode LCE2 can be referred to as an anode connection electrode electrically connected to the second electrode E2 as the anode electrode.

In this way, the second line connection electrode LCE2 can be electrically connected to the second source/drain electrode SD2 of the thin-film transistor TFT, and the second electrode E2 as the anode electrode of the light-emitting element ED, such that the driving signal from the thin-film transistor TFT can be applied to the anode electrode of the light-emitting element ED.

A spacer SPC can be formed between the second overcoat layer OC2 and the first line connection electrode LCE1.

A lower surface of the spacer SPC can be disposed so as to be in contact with the second overcoat layer OC2, and an upper surface of the spacer SPC can be disposed so as to be in contact with the first line connection electrode LCE1.

Accordingly, the first line connection electrode LCE1 can be disposed to cover the upper surface and a portion of a side surface of the spacer SPC.

The spacer SPC can include an organic material, for example, a photoactive compound (PAC). However, the present disclosure is not limited thereto.

The spacer SPC can maintain a spacing between the wiring substrate 20 and the panel unit 10 and, furthermore, can play a role in increasing the spacing.

When the spacing between the wiring substrate 20 and the panel unit 10 is increased via the spacer SPC, a spacing between the light-emitting element ED and the photo transistor PHT increases.

Accordingly, even when the photo transistor PHT is located on one side of the light-emitting element ED, the spacer SPC can allow a minimum angle at which the photo transistor PHT senses the light emitted from the light-emitting element ED toward a position on a side of the light-emitting element ED as effectively as possible to be secured.

A contact member 300 can be disposed on the first line connection electrode LCE1.

Specifically, the contact member 300 can be disposed on a portion of the first line connection electrode LCE1 that overlaps the spacer SPC in the vertical direction.

The contact member 300 can serve as a medium to electrically connect the first line connection electrode LCE1 of the panel unit 10 and the link line LL of the wiring substrate 20 to each other.

Furthermore, the contact member 300 can be made of a conductive material.

For example, the conductive contact member 300 can be formed as a metal layer, or be made of conductive ink, or conductive paste such as silver paste. However, the present disclosure is not limited thereto.

Furthermore, the contact member 300 can act as an adhesive contact member including an adhesive component.

As the conductive contact member 300 has the adhesive component, the first line connection electrode LCE1 of the panel unit 10 and the link line LL of the wiring substrate 20 can be electrically connected and bonded to each other via the conductive contact member 300.

The wiring substrate 20 can include a second substrate 200, the plurality of photo transistors PHT, and the various link lines LL disposed on the second substrate 200.

The second substrate 200 can be made of a transparent material including glass or plastic.

Accordingly, the photo transistor PHT can be formed on the second substrate 200.

Specifically, the photo gate electrode PGE can be formed, and the gate insulating layer GI can be formed to cover the photo gate electrode PGE.

The photo active layer PACT can be formed on the gate insulating layer GI. On the photo active layer PACT, the first photo electrode PE1 in contact with one side of the photo active layer PACT, and the second photo electrode PE2 in contact with the other side of the photo active layer PACT can be formed.

A passivation layer PAS can be formed on the first photo electrode PE1 and the second photo electrode PE2, and an overcoat layer OC can be formed to cover the passivation layer PAS.

The overcoat layer OC can be act as a planarization layer and can serve to remove a step caused by an underlying element such as the photo transistor PHT, etc., to provide a planarized top surface.

The overcoat layer OC can include an organic material, for example, a photoactive compound (PAC). However, the present disclosure is not limited thereto.

Furthermore, the overcoat layer OC can maintain the spacing between the wiring substrate 20 and the panel unit 10, and furthermore, can serve to increase the spacing.

When the spacing between the wiring substrate 20 and the panel unit 10 is increased via the overcoat layer OC, the spacing between the light-emitting element ED and the photo transistor PHT also increases.

Accordingly, even when the photo transistor PHT is located on one side of the light-emitting element ED, the overcoat layer OC can allow a minimum angle at which the photo transistor PHT senses the light emitted from the light-emitting element ED toward a position on a side of the light-emitting element ED as effectively as possible to be secured.

In the display device 1 according to an embodiment of the present disclosure, the panel unit 10 in which the light-emitting element ED is disposed and the wiring substrate 20 in which the photo transistor PHT is disposed can be formed in separate processes and, then, can be bonded to each other. Thus, the light-emitting element ED and the photo transistor PHT can be positioned in different layers.

Specifically, it is preferable that in order to effectively sense the light emitted from the light-emitting element ED, the photo transistor PHT is located on top of the light-emitting element ED.

However, when the light-emitting element ED and the photo transistor PHT vertically overlap each other, the light efficiency of the light-emitting element ED can be reduced due to the photo transistor PHT.

Accordingly, according to one embodiment of the present disclosure, the light-emitting element ED and the photo transistor PHT may not overlap each other vertically.

For example, referring to FIG. 4 to FIG. 5 and FIG. 10 to FIG. 13, when the panel unit 10 including the light-emitting element ED and the wiring substrate 20 including the photo transistor PHT are bonded to each other, the light-emitting element ED and the photo transistor PHT can be disposed so as not to overlap each other in the vertical direction.

However, when the photo transistor PHT is too far away from the light-emitting element ED, it can be difficult for the photo transistor PHT to effectively sense the light from the light-emitting element ED. For this reason, the photo transistor PHT can be disposed as close to the light-emitting element ED as possible.

Therefore, even if the photo transistor PHT and the light-emitting element ED are arranged so that they do not overlap in the vertical direction, it is preferable that the photo transistor PHT and the light-emitting element ED are arranged as close as possible.

In this way, because the photo transistor PHT is disposed so as not to overlap with the light-emitting element ED in the vertical direction, the spacing in the vertical direction between the photo transistor PHT and the light-emitting element ED can be increased, such that the light emitted from the light-emitting element ED toward a position on the side of the light-emitting element ED can be maximally sensed by the photo transistor PHT.

Thus, according to the first embodiment, the spacer SPC and the overcoat layer OC which can be made of the organic material that is advantageous in forming a structure with a predetermined height can be disposed between the photo transistor PHT and the light-emitting element ED.

The second embodiment in which the spacing between the photo transistor PHT and the light-emitting element ED can be increased will be described with reference to FIG. 3.

Figure 3:
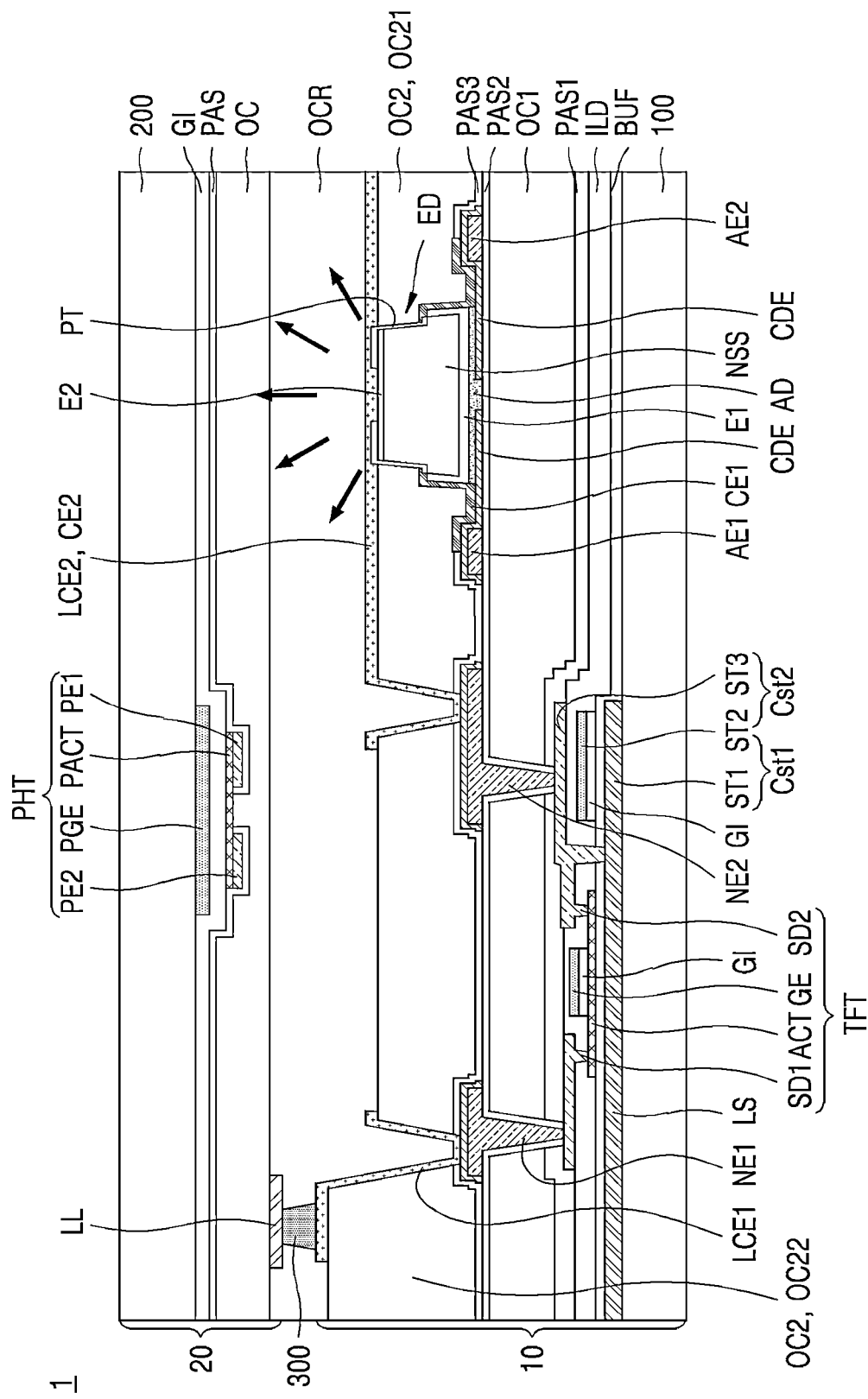
FIG. 3 is a cross-sectional view corresponding to one sub-pixel in a state in which a wiring substrate and a panel unit are bonded to each other according to a second embodiment of the present disclosure.

Referring to FIG. 3, the second overcoat layer OC2 disposed on the light-emitting element ED and the thin-film transistor TFT can be composed of a step formation layer OC22 and a reference layer OC21 with different heights.

A height of the step formation layer OC22 can be larger than a height of the reference layer OC21.

A photo process using a halftone mask can be used to form of the step formation layer OC22 and the reference layer OC21 of the same overcoat layer OC having the different heights.

In this case, the first line connection electrode LCE1 whose one side is electrically connected to the thin-film transistor TFT can be partially formed on the step formation layer OC22 of the second overcoat layer OC2. Specifically, a lower surface of the first line connection electrode LCE1 can be in contact with the second overcoat layer OC2.

Further, the reference layer OC21 of the second overcoat layer OC2 can be formed to cover the light-emitting element ED.

In other words, the light-emitting element ED can be located in the reference layer OC21.

Accordingly, unlike the first embodiment, in the second embodiment, even when a step adjustment member such as the separate spacer SPC is not formed, the same effect as the effect of the separate spacer SPC can be obtained due to the difference between the heights of the partial areas of the overcoat layer, resulting in improved process efficiency.

The plurality of link lines LL can be formed on the overcoat layer OC of the wiring substrate 20.

Therefore, the photo control signal line for transmitting the photo control signal Vsto to the photo transistor PHT, the photo driving signal line for transmitting the photo driving signal Vdrv to the photo transistor PHT, and the photo sensing signal line that outputs the photo sensing signal Vsen from the photo transistor PHT can be positioned in a layer different from a layer in which the plurality of link lines LL are positioned.

The plurality of link lines LL formed on the overcoat layer OC can be electrically connected to the first line connection electrode LCE1 of the panel unit 10 via the contact member 300. Accordingly, line signals can be transmitted to the signal lines SL of the panel unit 10 via the link lines LL of the wiring substrate 20.

Figure 4:
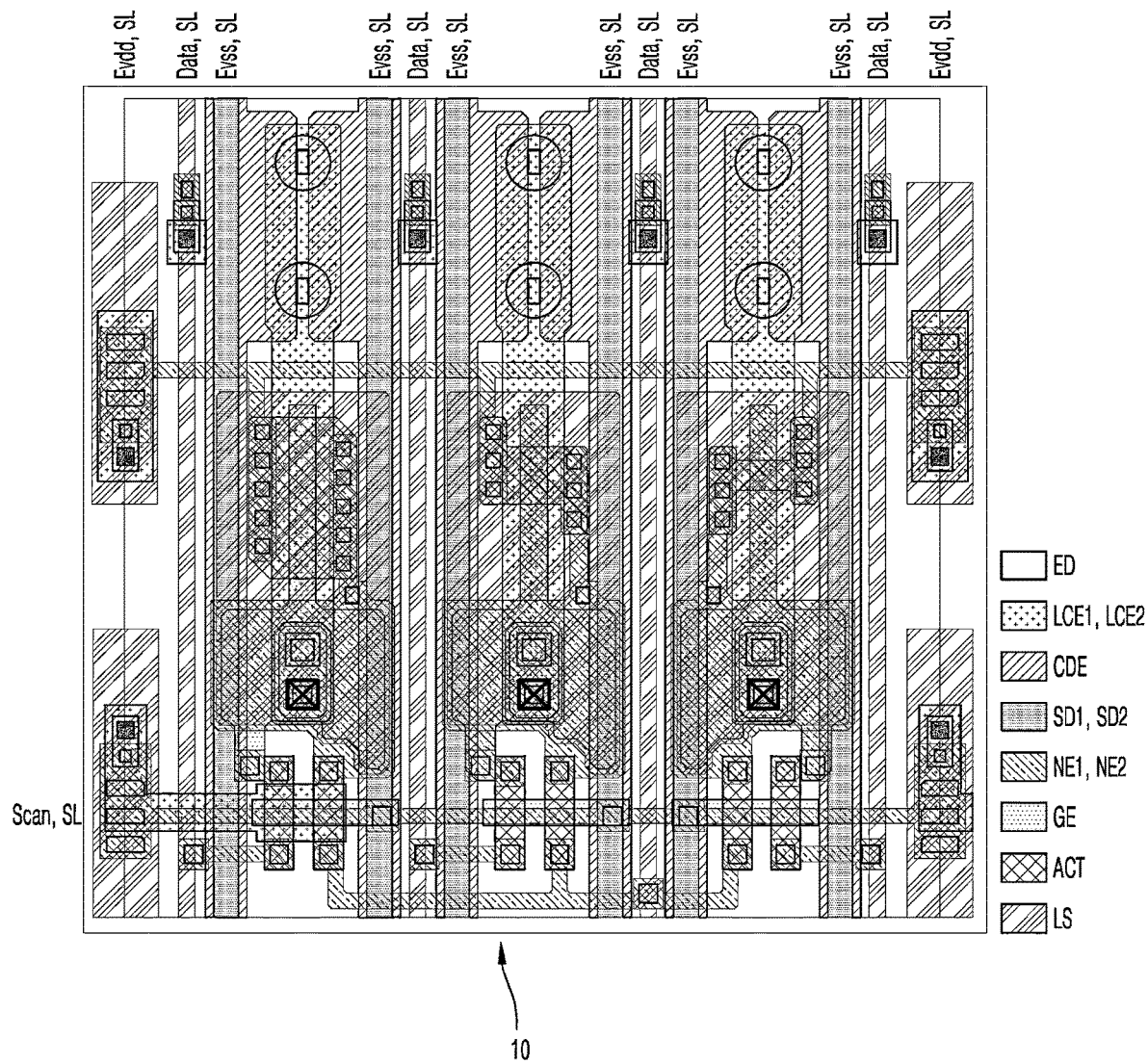
FIG. 4 is a plan view of a panel unit according to the first embodiment and the second embodiment of the present disclosure.
Figure 5:
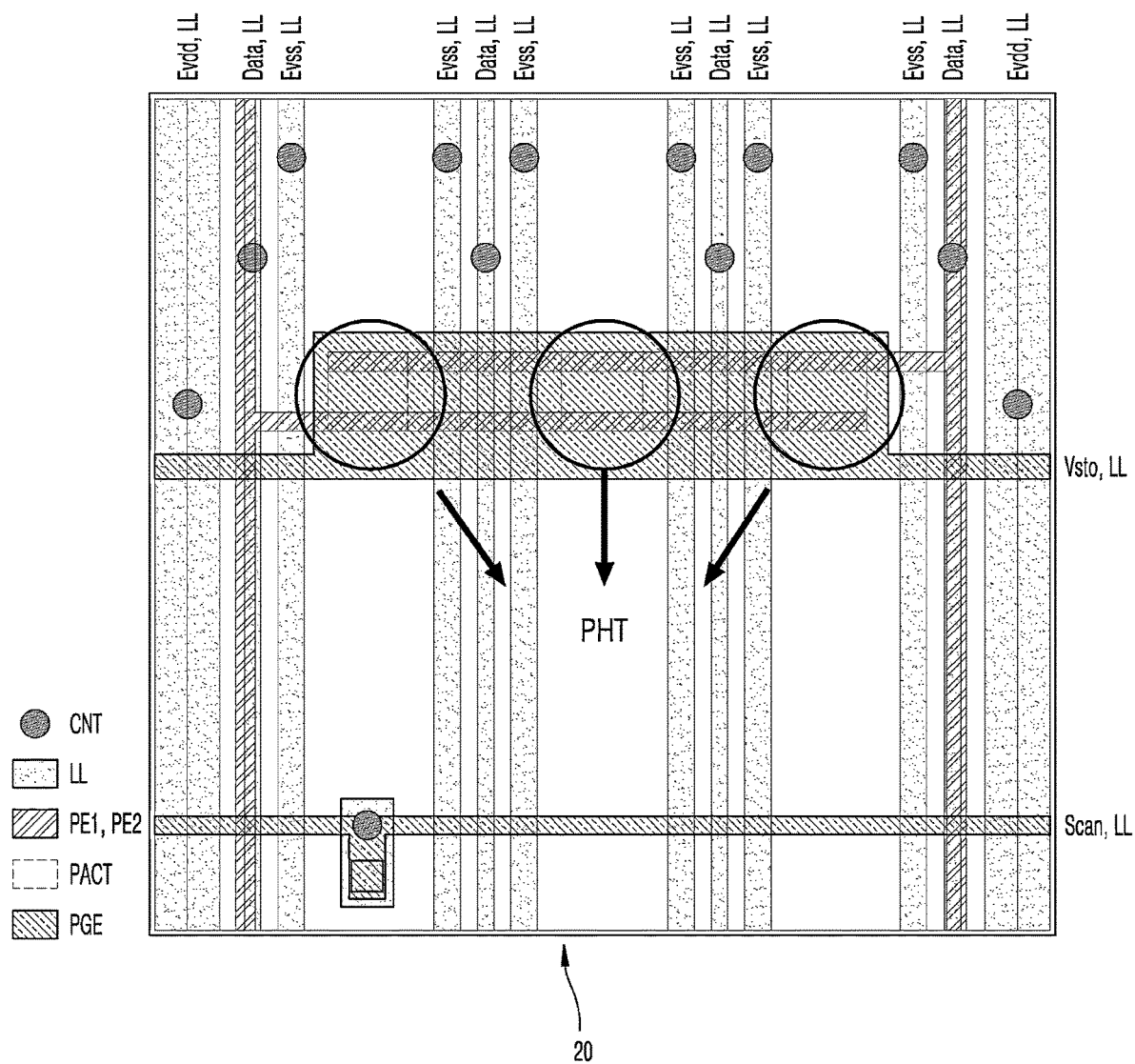
FIG. 5 is a plan view of the wiring substrate according to the first embodiment and the second embodiment of the present disclosure.

Referring to FIG. 4 and FIG. 5, the plurality of high-potential voltage (Evdd) link lines, the plurality of low-potential voltage (Evss) link lines, the plurality of data voltage (Data) link lines, and the plurality of scan (Scan) link lines formed in the wiring substrate 20 can be electrically connected to the plurality of high-potential voltage (Evdd) signal lines, the plurality of low-potential voltage (Evss) signal lines, the plurality of data voltage (Data) signal lines, and the plurality of scan (Scan) signal lines formed in the panel unit 10 via the contacts CNT included in the wiring substrate 20, respectively.

In other words, each of the plurality of contacts CNT as shown in FIG. 5 can correspond to a point where the contact member 300 is disposed so as to electrically connect the link line LL and the signal line SL to each other.

Figure 6:
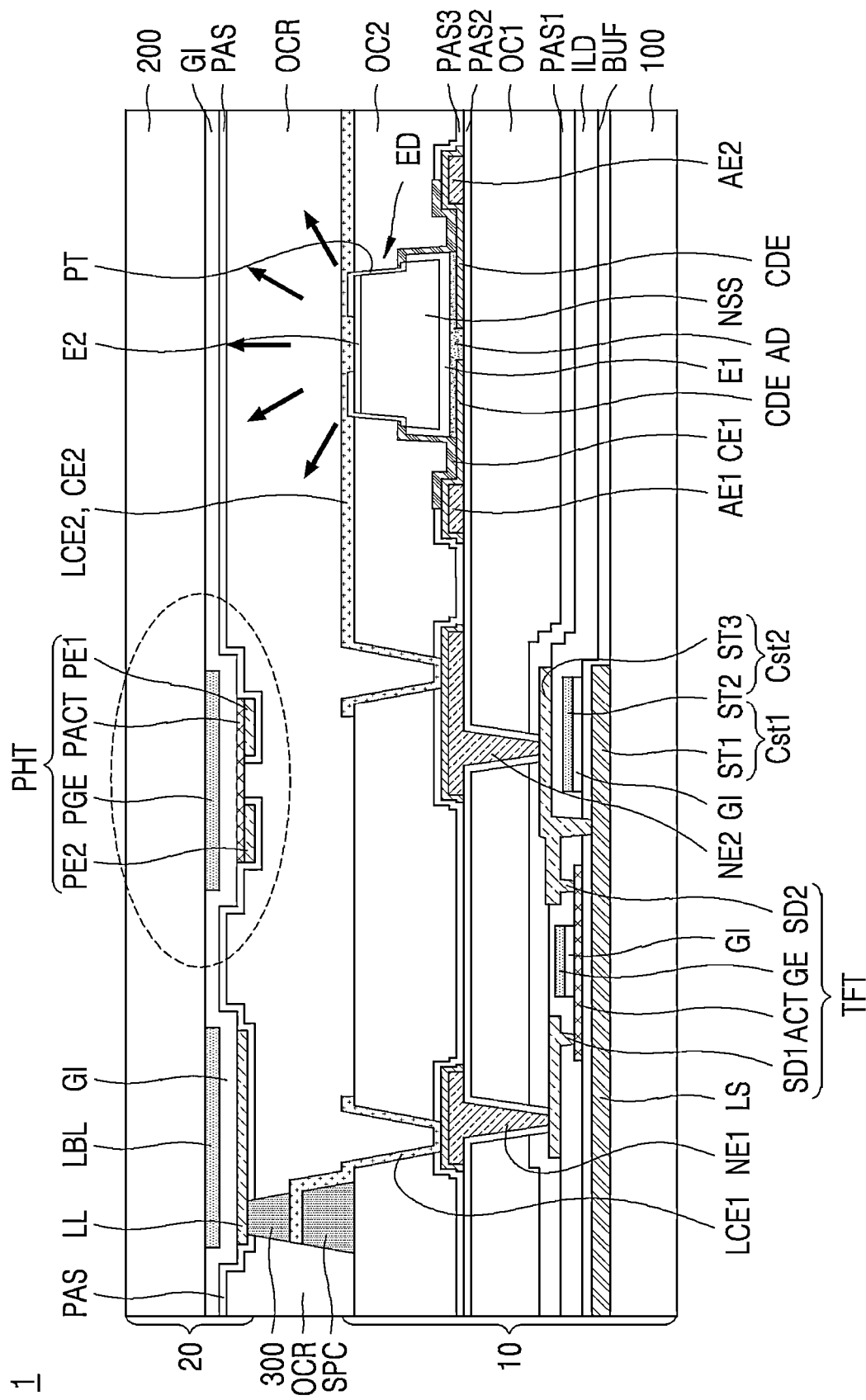
FIG. 6 is a cross-sectional view corresponding to one sub-pixel in a state in which a wiring substrate and a panel unit are bonded to each other according to a third embodiment of the present disclosure.

Hereinafter, with further reference to FIG. 6 to FIG. 8, a display device 1 according to a third embodiment of the present disclosure will be described.

Descriptions about the third embodiment that duplicate with the above descriptions about the previous embodiments are omitted, and following descriptions are made mainly based on differences therebetween.

This can be equally applied to further embodiments as described further below.

The photo control signal line for transmitting the photo control signal Vsto to the photo transistor PHT, the photo driving signal line for transmitting the photo driving signal Vdrv to the photo transistor PHT, and the photo sensing signal line that outputs the photo sensing signal Vsen from the photo transistor PHT can be positioned in the same layer as a layer in which at least one of the plurality of link lines LL is positioned.

For example, a link branched line LBL made of the same material as that of the photo gate electrode PGE and positioned in the same layer as a layer in which the photo gate electrode PGE is positioned can be formed in the wiring substrate 20.

The gate insulating layer GI can be formed on the link branched line LBL, and the link line LL can be formed on the gate insulating layer GI.

The link line LL can be made of the same material as that of each of the first photo electrode PE1 and the second photo electrode PE2 and can be positioned in the same layer as a layer in which the first photo electrode PE1 and the second photo electrode PE2 are positioned.

The link branched line LBL can be a line branched from the link line LL so as to be electrically connected thereto.

The passivation layer PAS can be formed on the link line LL. The passivation layer PAS can be formed so that a portion of a surface area of the link line LL is exposed, and thus, the link line LL can be electrically connected to the contact member 300.

As the photo signal lines connected to the photo transistor PHT are disposed in the same layer as a layer in which at least one of the link lines LL is disposed, process efficiency and space utilization for formation of the photo signal lines connected to a structure sensing the light emitted from the light-emitting element ED can be increased, resulting in process optimization effect.

Figure 7:
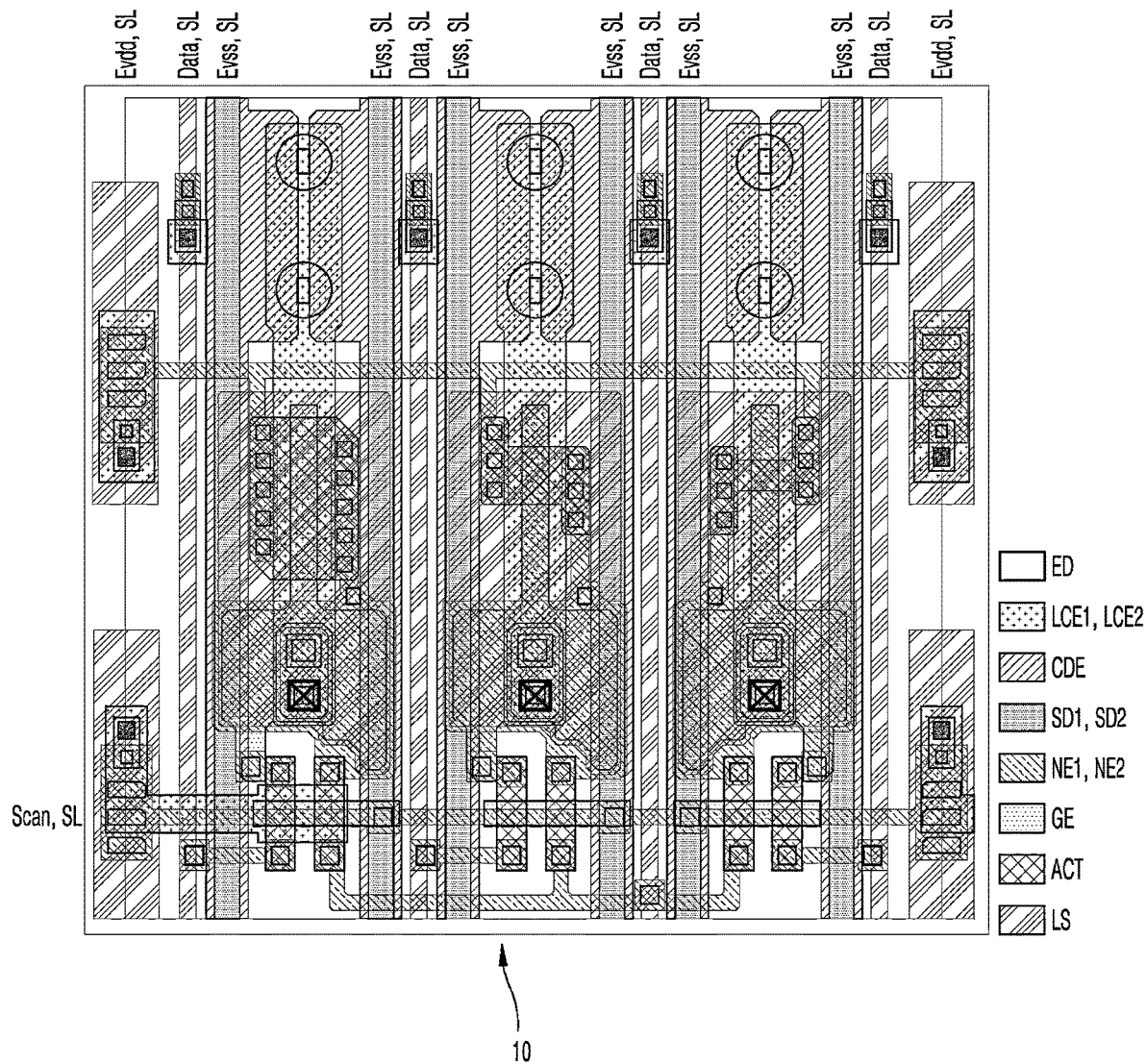
FIG. 7 is a plan view of a panel unit according to the third embodiment of the present disclosure.
Figure 8:
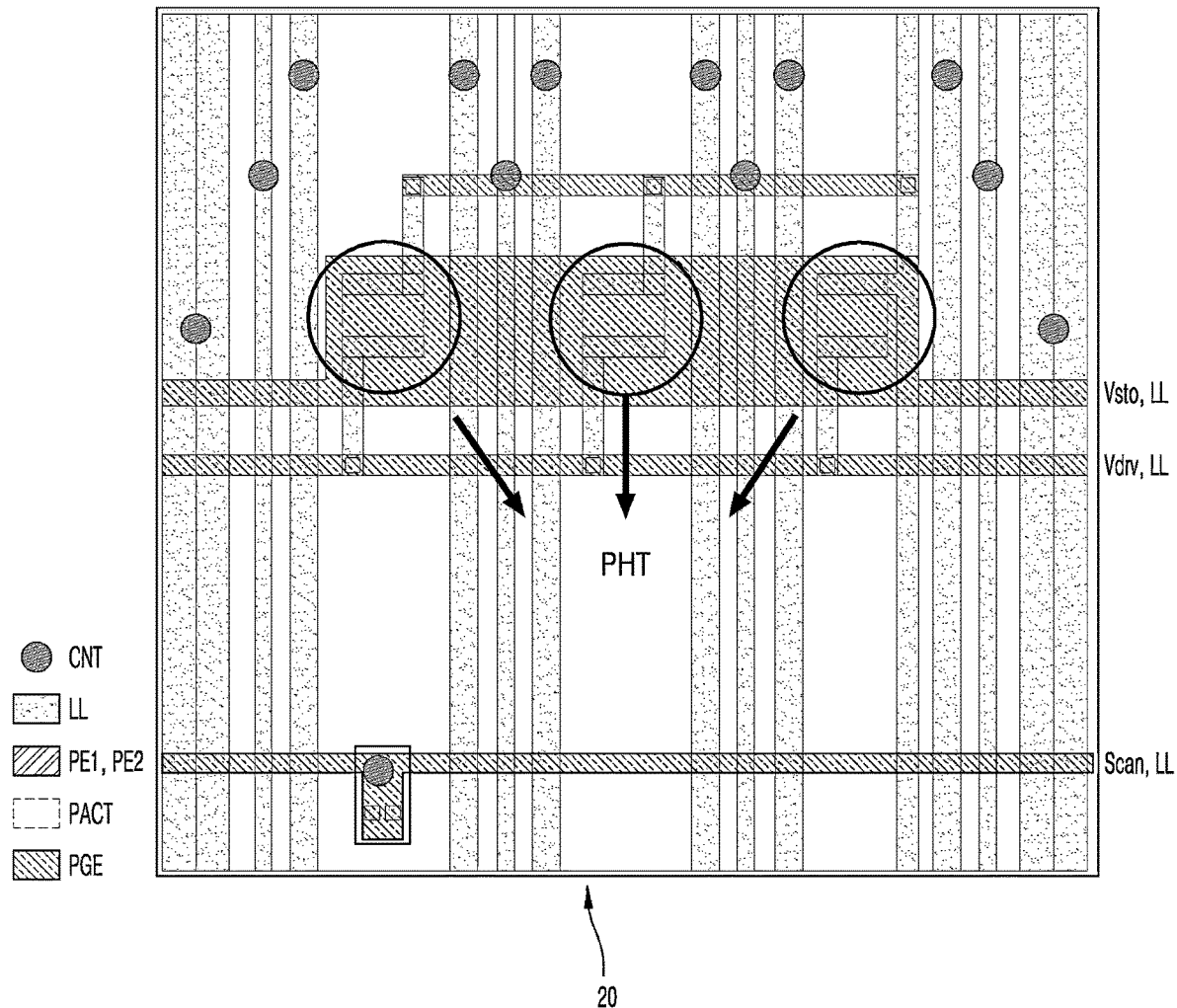
FIG. 8 is a plan view of the wiring substrate according to the third embodiment of the present disclosure.

Referring to FIG. 7 and FIG. 8, the plurality of high-potential voltage (Evdd) link lines, the plurality of low-potential voltage (Evss) link lines, the plurality of data voltage (Data) link lines, and the plurality of scan (Scan) link lines formed in the wiring substrate 20 can be electrically connected to the plurality of high-potential voltage (Evdd) signal lines, the plurality of low-potential voltage (Evss) signal lines, the plurality of data voltage (Data) signal lines, and the plurality of scan (Scan) signal lines formed in the panel unit 10 via the contacts CNT included in the wiring substrate 20, respectively.

In other words, each of the plurality of contacts CNT as shown in FIG. 8 can correspond to a point where the contact member 300 is disposed so as to electrically connect the link line LL and the signal line SL to each other.

Figure 9:
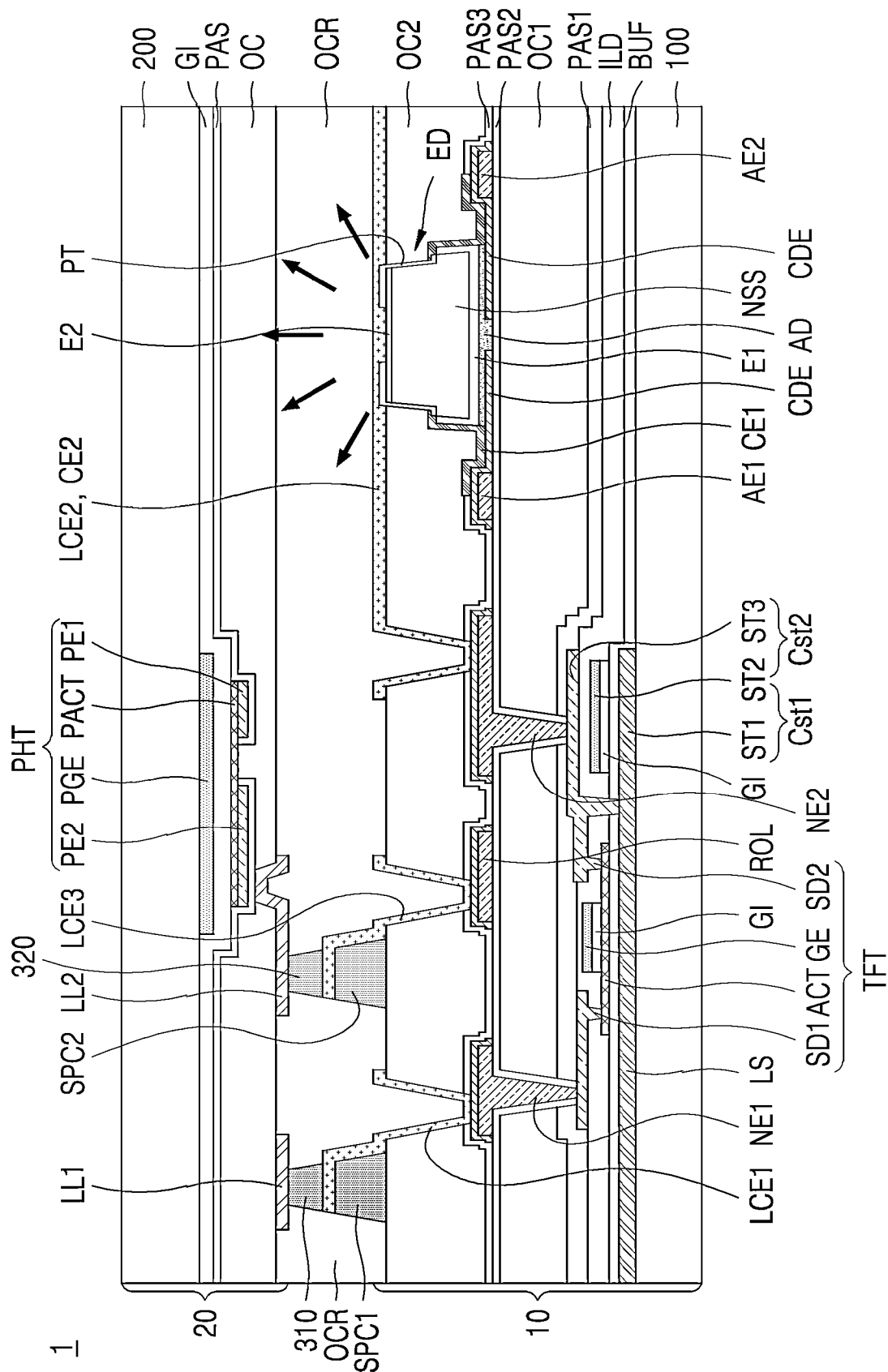
FIG. 9 is a cross-sectional view corresponding to one sub-pixel in a state in which a wiring substrate and a panel unit are bonded to each other according to a fourth embodiment of the present disclosure.

A display device 1 according to a fourth embodiment of the present disclosure can be described with further reference to FIG. 9.

A sensing circuitry that processes a sensing signal of the photo transistor PHT can be formed in the panel unit 10. The photo sensing signal line that outputs the photo sensing signal from the photo transistor PHT can be electrically connected to the sensing circuitry.

For example, the overcoat layer OC can be formed on the photo transistor PHT, and the plurality of link lines LL can be formed on the overcoat layer OC.

The plurality of link lines LL can include a plurality of first link lines LL1 and a plurality of second link lines LL2.

In this case, the driving line signal for the light-emitting element ED can be transmitted to the signal line SL of the panel unit 10 via an electrical connection between the first line connection electrode LCE1 and the first link line LL1 which transmits the driving line signal.

In this case, a first contact member 310 can be formed between the first link line LL1 and the first line connection electrode LCE1. A first spacer SPC1 can be formed between the first line connection electrode LCE1 and the second overcoat layer OC2.

Furthermore, the link line LL can include the second link line LL2 which transmits the photo sensing signal Vsen of the photo transistor PHT. The second link line LL2 can be electrically connected to the sensing circuitry formed in the panel unit 10. Thus, the photo sensing signal Vsen can be applied to the sensing circuitry.

For this purpose, the readout line ROL electrically connected to the sensing circuitry can be formed on the second passivation layer PAS2 of the panel unit 10.

The readout line ROL can be made of the same material as that of each of the first source/drain connection electrode NE1 and the second source/drain connection electrode NE2 and can be positioned in the same layer as a layer in which the first source/drain connection electrode NE1 and the second source/drain connection electrode NE2 are positioned.

A clad electrode layer CDE, a third passivation layer PAS3, and a second overcoat layer OC2 can be formed on the readout line ROL.

A third line connection electrode LCE3 can be formed on the second overcoat layer OC2. The third line connection electrode LCE3, and the first line connection electrode LCE1 and the second line connection electrode LCE2 can be made of the same material and can be positioned in the same layer.

A contact hole can extend through the second overcoat layer OC2 and the third passivation layer PAS3 so as to expose a portion of a surface of the readout line ROL.

Accordingly, the third line connection electrode LCE3 can be electrically connected to the readout line ROL via an exposed portion of the clad electrode layer CDE exposed through the contact hole.

In this case, a second spacer SPC2 can be formed between the third line connection electrode LCE3 and the second overcoat layer OC2. A second contact member 320 can be formed between the third line connection electrode LCE3 and the second link line LL2.

The second link line LL2 can be electrically connected to the second photo electrode PE2 of the photo transistor PHT via a contact hole extending through the overcoat layer OC and the passivation layer PAS.

Therefore, the photo sensing signal Vsen output from the second photo electrode PE2 of the photo transistor PHT can be transmitted to the readout line ROL electrically connected to the sensing circuitry via an electrical connection structure such as the second link line LL2, the second contact member 320, and the third line connection electrode LCE3.

Figure 14:
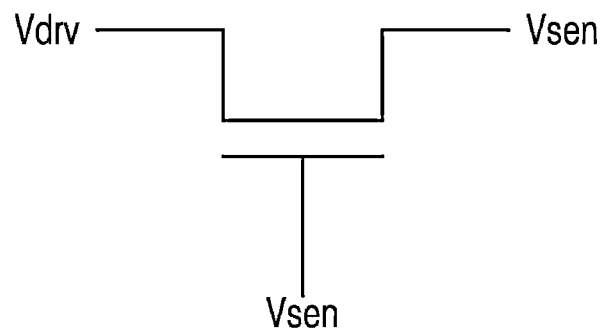
FIG. 14 is a circuit diagram of a photo transistor according to one embodiment of the present disclosure.

Hereinafter, with further reference to FIG. 14 to FIG. 16, an example operation of the photo transistor PHT according to a fifth embodiment of the present disclosure will be described.

In the photo transistor PHT, the photo control signal Vsto can be applied to the photo gate electrode PGE as a gate electrode thereof, the photo driving signal Vdrv can be applied to the first photo electrode PE1 as a source electrode thereof, and the photo sensing signal Vsen can be output from the second photo electrode PE2 as a drain electrode thereof.

As previously described, in a state in which the photo control signal Vsto of a low level has been applied to the photo gate electrode PGE, and the photo driving signal Vdrv of a high level has been applied to the first photo electrode PE1, the photo transistor sensor can sense the off-current caused by internal and external light sources.

For example, when light is incident into the photo transistor PHT in a state in which the photo transistor PHT has been turned off, for example, after a low voltage is applied to the photo gate electrode PGE and a high voltage is applied to the photo source electrode, the photo transistor PHT can sense a leakage current via the photo drain electrode.

According to an embodiment of the present disclosure, this sensing mechanism of the photo transistor sensor can be implemented in an active matrix (AM) manner to secure position coordinates of a sensing value.

Figure 15:
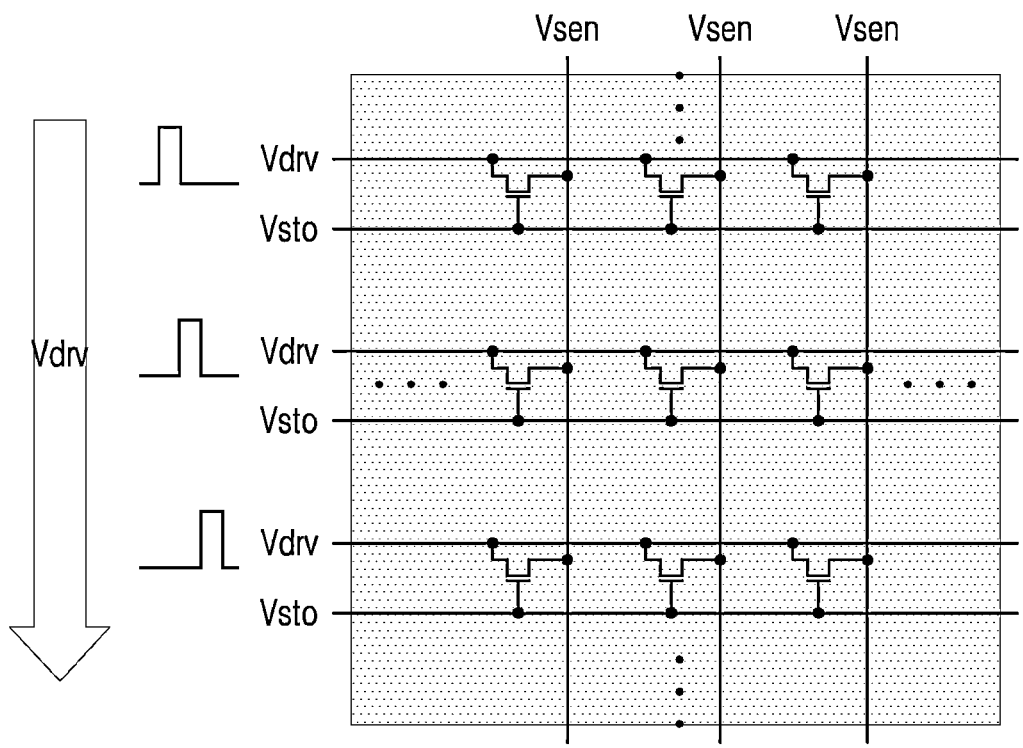
FIG. 15 and FIG. 16 show an example operation of a photo transistor according to a fifth embodiment of the present disclosure.
Figure 16:
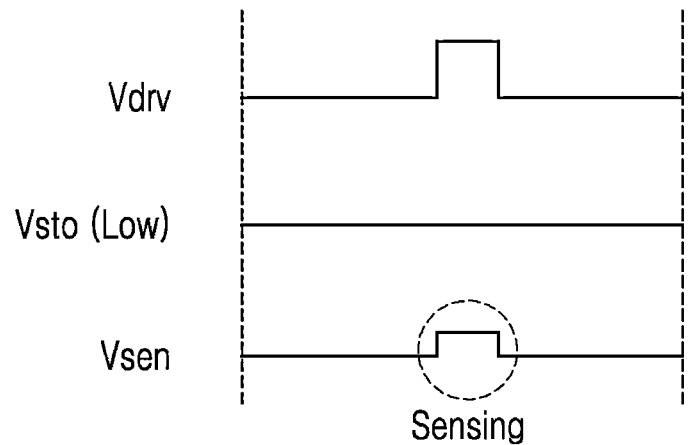

As shown in FIG. 15, an address of a readout IC can be determined along an X-axis as a row direction, and the photo driving signal Vdrv can be sequentially activated/deactivated or turned on/off along a Y-axis as a column direction.

For example, in order to distinguish the Y-axis position coordinates from each other, the photo driving signal Vdrv can be sequentially activated in an order from a first stage to an N-th stage while a level of the photo control signal Vsto is fixed to a low voltage.

In this case, the photo transistor PHT can operate only at a specific timing during which the photo driving signal Vdrv is at a high level. The photo transistor PHT may not operate in the remaining period during which the photo driving signal Vdrv is at a low level.

In this way, when a sensing value is output from the photo transistor PHT at the specific timing during which the photo transistor PHT operates, it is determined that the light is incident on the photo transistor PHT. The Y-axis position coordinate value can be determined based on the specific timing.

In this case, when the light is not incident on the photo transistor PHT, no sensing value is output therefrom even at the specific timing during which the photo transistor PHT operates.

According to one embodiment of the present disclosure, a low level voltage can be applied to the plurality of photo control signal lines that transmit the photo control signal Vsto to the photo transistor PHT. A high level voltage can be applied to the plurality of photo driving signal lines transmitting the photo driving signal Vdrv to the photo transistor PHT sequentially along one direction. Thus, a position coordinate of the photo transistor PHT as sensed among the plurality of photo transistors arranged in the one direction can be identified.

In this case, a plurality of photo transistors PHT arranged in one direction can share one photo sensing signal Vsen line that outputs the photo sensing signal Vsen from the photo transistor PHT with each other.

The photo control signal line which transmits the photo control signal Vsto to the photo transistor PHT can be formed integrally with the low-potential voltage link lines Evss. The photo sensing signal line which outputs the photo sensing signal Vsen from the photo transistor PHT can be formed integrally with the reference voltage (Ref) link line.

As each of some of the photo signal lines and each of some of the link lines LL are formed integrally with each other and constitute the same line, there is no need to form the photo signal line separate from the link line LL, such that process efficiency and space utilization of the wiring substrate 20 can be improved.

Hereinafter, with further reference to FIG. 17 to FIG. 18, an example operation of the photo transistor PHT according to a sixth embodiment of the present disclosure will be described.

Figure 17:
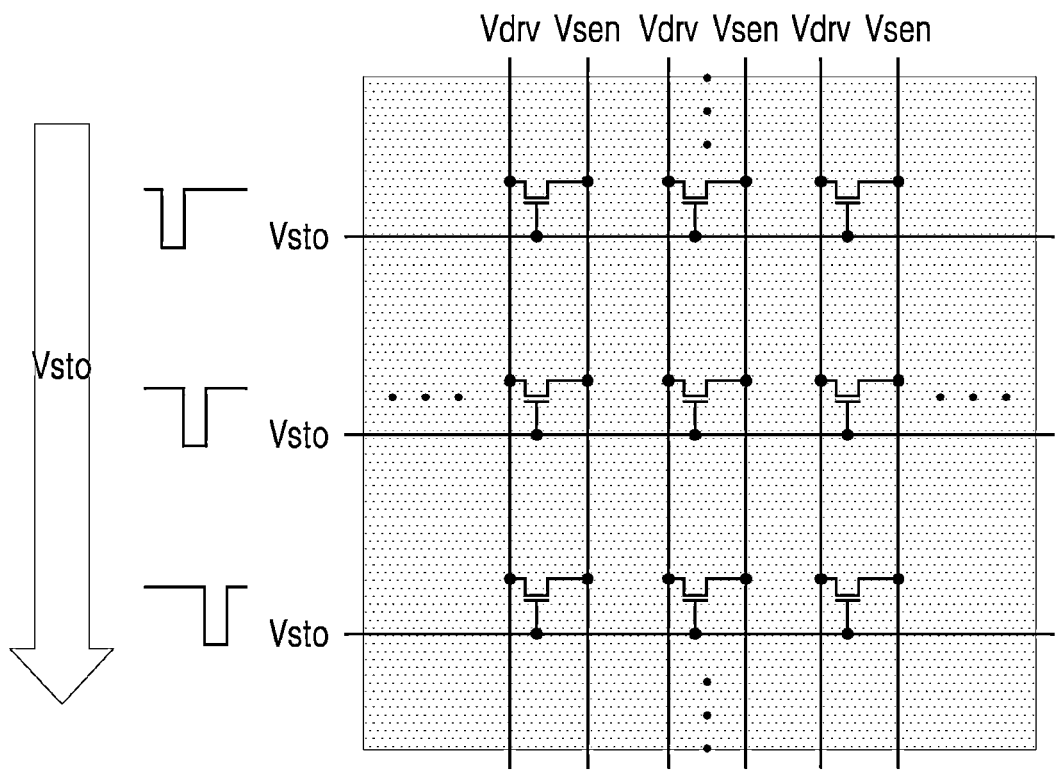
FIG. 17 and FIG. 18 show an example operation of a photo transistor according to a sixth embodiment of the present disclosure.
Figure 18:
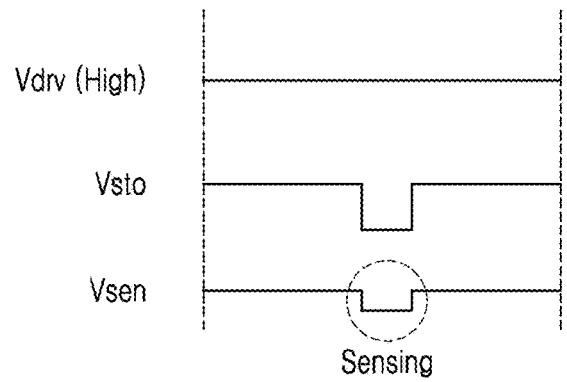

As shown in FIG. 17, an address of a readout integrated circuit (IC) can be determined along an X-axis as a row direction, and the photo control signal Vsto can be sequentially activated/deactivated or turned on/off along a Y-axis as a column direction.

For example, in order to distinguish the Y-axis position coordinates from each other, the photo control signal Vsto can be sequentially activated in an order from a first stage to an N-th stage while a level of the photo driving signal Vdrv is fixed to a high voltage.

In this case, the photo transistor PHT can operate only at a specific timing during which the photo control signal Vsto is at a low level. The photo transistor PHT can generates a full high voltage in the remaining period during which the photo control signal Vsto is at a high level.

In this way, when a sensing value is output from the photo transistor PHT at the specific timing during which the photo transistor PHT operates, it is determined that the light is incident on the photo transistor PHT. The Y-axis position coordinate value can be determined based on the specific timing.

In this case, when the light is not incident on the photo transistor PHT, only a full high sensing value is output therefrom even at the specific timing during which the photo transistor PHT operates.

According to one embodiment of the present disclosure, the photo transistors PHT arranged in one direction can share each of one photo sensing signal line that outputs the photo sensing signal Vsen from the photo transistor PHT, and one photo driving signal line which applies the photo driving signal Vdrv to the photo transistor PHT and to which a high level voltage is applied with each other. The low level voltage can be applied to the plurality of photo control signal lines that transmit the photo control signal Vsto to the photo transistor PHT sequentially along one direction. Thus, a position coordinate of the photo transistor PHT as sensed among the plurality of photo transistors arranged in the one direction can be identified.

The photo driving signal line which transmits the photo driving signal Vdrv to the photo transistor PHT can be formed integrally with the high-potential voltage (Evdd) link lines.

In this way, as each of some of the photo signal lines and each of some of the link lines LL are formed integrally with each other and constitute the same line, there is no need to form the photo signal line separate from the link line LL, such that process efficiency and space utilization of the wiring substrate 20 can be improved.

Figure 19:
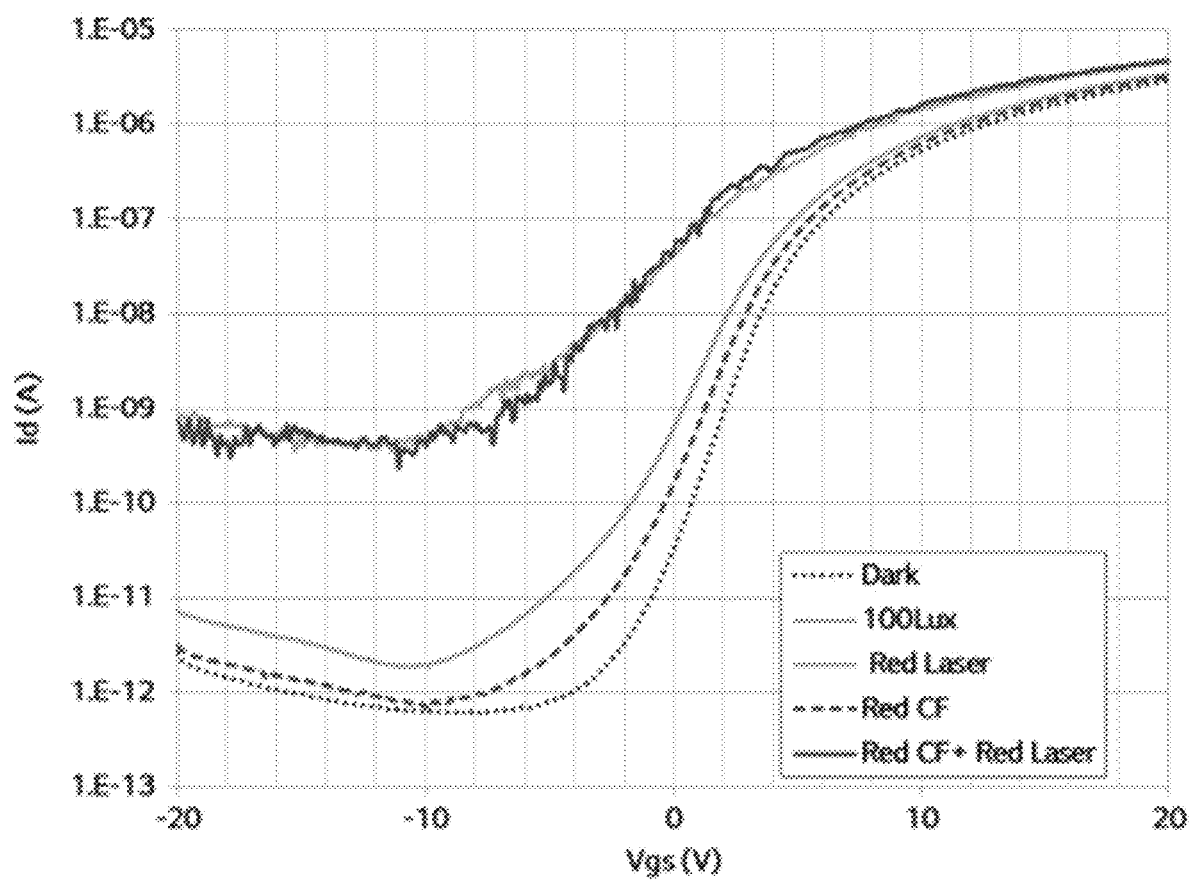
FIG. 19 and FIG. 20 are graphs measuring a leakage current value of the photo transistor based on illuminance.
Figure 20:
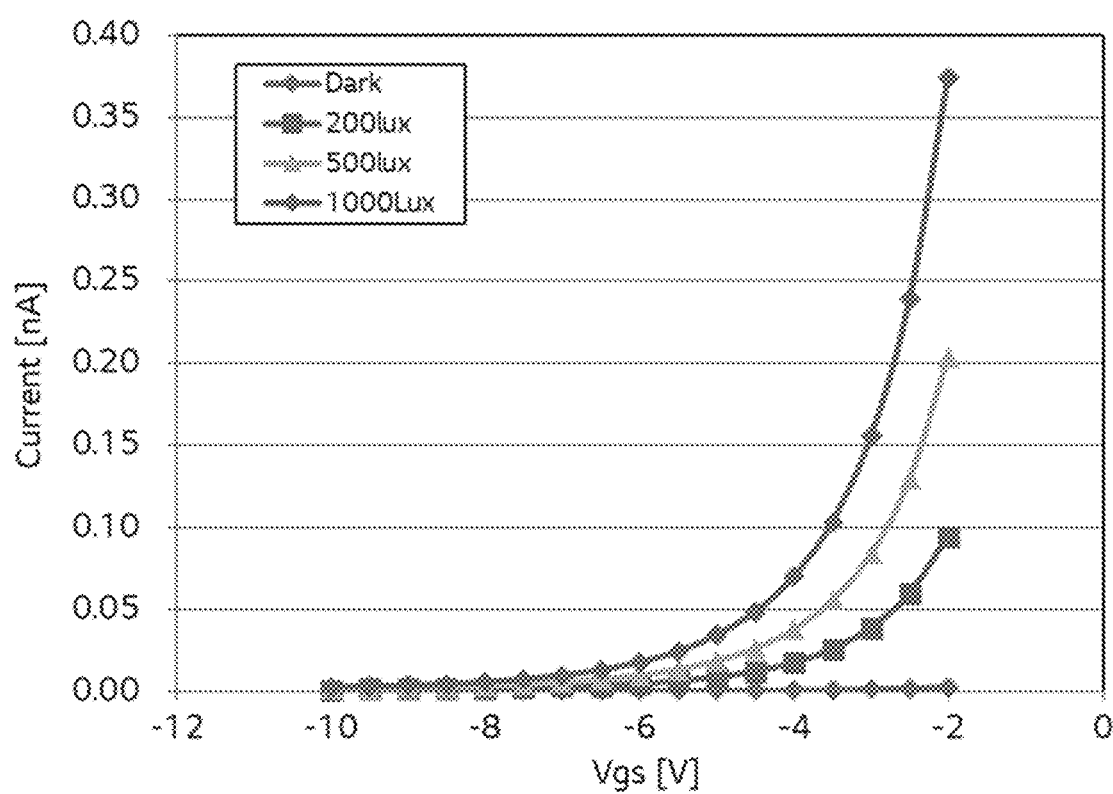

FIG. 19 and FIG. 20 are graphs of measurement of a leakage current value of the photo transistor based on illuminance.

A Vgs value on the X-axis means a difference between a voltage of the photo control signal Vsto and a voltage of the photo sensing signal Vsen, and a Y-axis value means the leakage current Id.

Referring to FIG. 19, based on a result of checking the leakage current (Off current) based on the photo driving signal Vdrv being 20V, the leakage current value increases slightly when the illuminance is 100 Lux or when the red color filter (Red CF) is used, compared to the dark state. Further, based on a result of checking the leakage current (Off current) based on the photo driving signal Vdrv being 20V, the leakage current value increases significantly by approximately 1,000 times or larger when a red laser was used or when a red laser and a red color filter are used together, compared to the dark state.

Furthermore, referring to FIG. 20, it is identified that the leakage current value increases significantly as the luminance intensity increases to 200 Lux, 500 Lux, and 1000 Lux, compared to the dark state.

Accordingly, it can be identified that the photo transistor PHT has a significant difference value depending on the illuminance, and that the current value can be increased or decreased by adjusting the Vgs value.

An aspect and embodiments of a display device according to the present disclosure will be described as follows.

An aspect of the present disclosure provides a display device comprising: a plurality of panel units, each including at least one light-emitting element; and a wiring substrate including: a plurality of link lines for transmitting a line signal to the panel unit; and a plurality of photo transistors for sensing light emitted from the light-emitting elements, wherein the plurality of panel units are bonded onto the wiring substrate in a tiling manner.

According to some embodiments of the display device of the present disclosure, a vertical level of the photo transistor is higher than a vertical level of the light-emitting element, wherein at least one overcoat layer or at least one spacer is disposed between the photo transistor and the light-emitting element.

According to some embodiments of the display device of the present disclosure, the overcoat layer and the spacer are made of organic material.

According to some embodiments of the display device of the present disclosure, the photo transistor and the light-emitting element non-overlap each other in a vertical direction.

According to some embodiments of the display device of the present disclosure, the panel unit further includes a thin-film transistor configured to apply a driving signal to the light-emitting element; an overcoat layer disposed on the light-emitting element and the thin-film transistor; a spacer disposed on the overcoat layer; a line connection electrode electrically connected to the thin-film transistor and disposed to cover the spacer; and a conductive contact member disposed on the line connection electrode so as to overlap the spacer in a vertical direction, wherein the conductive contact member contacts the link line.

According to some embodiments of the display device of the present disclosure, the panel unit further incudes: a thin-film transistor configured to apply a driving signal to the light-emitting element; an overcoat layer disposed on the light-emitting element and the thin-film transistor; a line connection electrode electrically connected to the thin-film transistor and disposed on the overcoat layer; and a conductive contact member disposed on the line connection electrode and in contact with the link line, wherein the overcoat layer includes a reference layer and a step formation layer having a height higher than a height of the reference layer, wherein the conductive contact member is disposed on the step formation layer.

According to some embodiments of the display device of the present disclosure, the light-emitting element is located in the reference layer.

According to some embodiments of the display device of the present disclosure, the wiring substrate further includes a photo control signal line for transmitting a photo control signal to the photo transistor; a photo driving signal line for transmitting a photo driving signal to the photo transistor; and a photo sensing signal line for outputting a photo sensing signal from the photo transistor, wherein the photo control signal line, the photo driving signal line, and the photo sensing signal line are positioned in a layer different from a layer in which the link lines are positioned.

According to some embodiments of the display device of the present disclosure, the wiring substrate further includes a photo control signal line for transmitting a photo control signal to the photo transistor; a photo driving signal line for transmitting a photo driving signal to the photo transistor; and a photo sensing signal line for outputting a photo sensing signal from the photo transistor, wherein the photo control signal line, the photo driving signal line, and the photo sensing signal line are positioned in the same layer as a layer in which at least one of the plurality of link lines is positioned.

According to some embodiments of the display device of the present disclosure, the panel unit further includes sensing circuitry configured to detect a photo sensing signal from the photo transistor, wherein the wiring substrate further includes a photo sensing signal line for outputting the photo sensing signal from the photo transistor, wherein the photo sensing signal line is electrically connected to the sensing circuitry.

According to some embodiments of the display device of the present disclosure, a plurality of photo transistors arranged in one direction share one photo sensing signal line for outputting a photo sensing signal from the photo transistor with each other, wherein a low level voltage is applied to a plurality of photo control signal lines for transmitting a photo control signal to the photo transistor, and a high level voltage is applied to a plurality of photo driving signal lines for transmitting a photo driving signal to the photo transistor sequentially along the one direction, such that a position coordinate of the photo transistor as sensed among the plurality of photo transistors arranged in the one direction is identified.

According to some embodiments of the display device of the present disclosure, a plurality of photo transistors arranged in one direction share each of one photo sensing signal line for outputting a photo sensing signal from the photo transistor and one photo driving signal line for transmitting a photo driving signal to the photo transistor, wherein a high level voltage is applied to the one photo driving signal line, and a low level voltage is applied to a plurality of photo control signal lines for transmitting a photo control signal to the photo transistor sequentially along the one direction, such that a position coordinate of the photo transistor as sensed among the plurality of photo transistors arranged in the one direction is identified.

According to some embodiments of the display device of the present disclosure, the plurality of link lines includes a high-potential voltage link line for transmitting a high-potential voltage to the panel unit; a low-potential voltage link line for transmitting a low-potential voltage to the panel unit; and a reference voltage link line for transmitting a reference voltage to the panel unit, wherein the wiring substrate further includes a photo control signal line for transmitting a photo control signal to the photo transistor; and a photo sensing signal line for outputting a photo sensing signal from the photo transistor, wherein the photo control signal line is formed integrally with the low-potential voltage link line, wherein the photo sensing signal line is formed integrally with the reference voltage link line.

According to some embodiments of the display device of the present disclosure, the plurality of link lines includes a high-potential voltage link line for transmitting a high-potential voltage to the panel unit; a low-potential voltage link line for transmitting a low-potential voltage to the panel unit; and a reference voltage link line for transmitting a reference voltage to the panel unit, wherein the wiring substrate further includes a photo driving signal line for transmitting a photo driving signal to the photo transistor, wherein the photo driving signal line is formed integrally with the high-potential voltage link line.

Although the embodiments of the present disclosure have been described in more detail with reference to the accompanying drawings, the present disclosure is not necessarily limited to these embodiments, and can be modified in a various manner within the scope of the technical spirit of the present disclosure.

What is claimed is:

1. A display device comprising:
   a plurality of panel units, each of the plurality of panel units including at least one light-emitting element; and
   a wiring substrate including:
   at least one link line configured to transmit a line signal to one of the plurality of panel units; and
   at least one photo transistor configured to sense light emitted from the at least one light-emitting element,
   wherein the plurality of panel units are bonded onto the wiring substrate in a tiling manner.

2. The display device of claim 1, wherein a vertical level of the at least one photo transistor is higher than a vertical level of the at least one light-emitting element, and
   wherein at least one overcoat layer or at least one spacer is disposed between the at least one photo transistor and the at least one light-emitting element.

3. The display device of claim 2, wherein the at least one overcoat layer and the at least one spacer are made of an organic material.

4. The display device of claim 1, wherein the at least one photo transistor and the at least one light-emitting element do not overlap each other in a vertical direction.

5. The display device of claim 1, wherein one of the plurality of panel units further includes:
   a thin-film transistor configured to apply a driving signal to the at least one light-emitting element;
   an overcoat layer disposed on the at least one light-emitting element and the thin-film transistor;
   a spacer disposed on the overcoat layer;
   a line connection electrode electrically connected to the thin-film transistor and disposed to cover the spacer; and
   a conductive contact member disposed on the line connection electrode so as to overlap the spacer in a vertical direction,
   wherein the conductive contact member contacts the at least one link line.

6. The display device of claim 1, wherein one of the plurality of panel units further incudes:
   a thin-film transistor configured to apply a driving signal to the at least one light-emitting element;

an overcoat layer disposed on the at least one light-emitting element and the thin-film transistor;
a line connection electrode electrically connected to the thin-film transistor and disposed on the overcoat layer; and
a conductive contact member disposed on the line connection electrode and in contact with the at least one link line,
wherein the overcoat layer includes a reference layer and a step formation layer having a height higher than a height of the reference layer, and
wherein the conductive contact member is disposed on the step formation layer.

7. The display device of claim 6, wherein the at least one light-emitting element is located in the reference layer.

8. The display device of claim 1, wherein the wiring substrate further includes:
a photo control signal line configured to transmit a photo control signal to the at least one photo transistor;
a photo driving signal line configured to transmit a photo driving signal to the at least one photo transistor; and
a photo sensing signal line configured to output a photo sensing signal from the at least one photo transistor,
wherein the photo control signal line, the photo driving signal line, and the photo sensing signal line are positioned in a layer different from a layer in which the at least one link line is positioned.

9. The display device of claim 1, wherein the wiring substrate further includes:
a photo control signal line configured to transmit a photo control signal to the at least one photo transistor;
a photo driving signal line configured to transmit a photo driving signal to the at least one photo transistor; and
a photo sensing signal line configured to output a photo sensing signal from the at least one photo transistor,
wherein the photo control signal line, the photo driving signal line, and the photo sensing signal line are positioned in the same layer as a layer in which the at least one link line is positioned.

10. The display device of claim 1, wherein one of the plurality of panel units further includes sensing circuitry configured to detect a photo sensing signal from the at least one photo transistor,
wherein the wiring substrate further includes a photo sensing signal line configured to output the photo sensing signal from the at least one photo transistor, and
wherein the photo sensing signal line is electrically connected to the sensing circuitry.

11. The display device of claim 1, wherein a plurality of photo transistors arranged in one direction share one photo sensing signal line for outputting a photo sensing signal from the at least one photo transistor with each other,
wherein a low level voltage is applied to a plurality of photo control signal lines configured to transmit a photo control signal to the at least one photo transistor, and
wherein a high level voltage is applied to a plurality of photo driving signal lines configured to transmit a photo driving signal to the at least one photo transistor sequentially along the one direction, so that a position coordinate of the at least one photo transistor as sensed among the plurality of photo transistors arranged in the one direction is identified.

12. The display device of claim 1, wherein a plurality of photo transistors arranged in one direction share each of one photo sensing signal line for outputting a photo sensing signal from the at least one photo transistor and one photo driving signal line for transmitting a photo driving signal to the at least one photo transistor,
wherein a high level voltage is applied to the one photo driving signal line, and
wherein a low level voltage is applied to a plurality of photo control signal lines for transmitting a photo control signal to the at least one photo transistor sequentially along the one direction, so that a position coordinate of the at least one photo transistor as sensed among the plurality of photo transistors arranged in the one direction is identified.

13. The display device of claim 1, wherein the at least one link line includes:
a high-potential voltage link line configured to transmit a high-potential voltage to one of the plurality of panel units;
a low-potential voltage link line configured to transmit a low-potential voltage to the one of the plurality of panel units; and
a reference voltage link line configured to transmit a reference voltage to the one of the plurality of panel units.

14. The display device of claim 13, wherein the wiring substrate further includes:
a photo control signal line configured to transmit a photo control signal to the at least one photo transistor; and
a photo sensing signal line configured to output a photo sensing signal from the at least one photo transistor,
wherein the photo control signal line is formed integrally with the low-potential voltage link line, and
wherein the photo sensing signal line is formed integrally with the reference voltage link line.

15. The display device of claim 1, wherein the at least one link line includes:
a high-potential voltage link line configured to transmit a high-potential voltage to one of the plurality of panel units;
a low-potential voltage link line configured to transmit a low-potential voltage to the one of the plurality of panel units; and
a reference voltage link line configured to transmit a reference voltage to the one of the plurality of panel units,
wherein the wiring substrate further includes a photo driving signal line for transmitting a photo driving signal to the at least one photo transistor, and
wherein the photo driving signal line is formed integrally with the high-potential voltage link line.

16. A display device comprising:
a plurality of panel units, each including:
a plurality of light-emitting elements; and
a plurality of signal lines connected to the plurality of light-emitting elements; and
a wiring substrate including:
a plurality of link lines connected to the plurality of signal lines on the plurality of panel units, respectively; and
a photo transistor configured to sense light emitted from the plurality of light-emitting elements,
wherein the plurality of panel units are bonded onto the wiring substrate in a tiling manner.

17. The display device of claim 16, wherein light emitted from a light-emitting element in a turned-off state is sensed by the photo transistor to determine an off-current output of the light-emitting element.

18. The display device of claim 17, wherein current of a thin-film transistor that drives the light-emitting element is sensed to compensate for the difference between luminance of the light-emitting elements.

* * * * *